United States Patent
Fujimaki et al.

(10) Patent No.: US 10,497,726 B2
(45) Date of Patent: Dec. 3, 2019

(54) SEMICONDUCTOR DEVICE HAVING SILICON DEVICES IN A SILICON LAYER AND OXIDE SEMICONDUCTOR DEVICES IN AN OXIDE SEMICONDUCTOR LAYER OF A SAME CHIP AND SEMICONDUCTOR DEVICE MANUFACTURING METHOD

(71) Applicant: LAPIS SEMICONDUCTOR CO., LTD., Kanagawa (JP)

(72) Inventors: Hirokazu Fujimaki, Kanagawa (JP); Koichi Kaneko, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 15/624,617

(22) Filed: Jun. 15, 2017

(65) Prior Publication Data
US 2017/0365629 A1    Dec. 21, 2017

(30) Foreign Application Priority Data

Jun. 17, 2016    (JP) .................................. 2016-121190

(51) Int. Cl.
| | |
|---|---|
| *H01L 27/144* | (2006.01) |
| *H01L 31/02* | (2006.01) |
| *H01L 31/028* | (2006.01) |
| *H01L 31/032* | (2006.01) |
| *H01L 31/036* | (2006.01) |
| *H01L 31/103* | (2006.01) |
| *H01L 31/108* | (2006.01) |
| *H01L 31/18* | (2006.01) |

(52) U.S. Cl.
CPC ........ *H01L 27/1443* (2013.01); *H01L 31/028* (2013.01); *H01L 31/02019* (2013.01); *H01L 31/032* (2013.01); *H01L 31/036* (2013.01); *H01L 31/103* (2013.01); *H01L 31/108* (2013.01); *H01L 31/18* (2013.01)

(58) Field of Classification Search
CPC .... H01L 29/04; H01L 27/1443; H01L 31/036
See application file for complete search history.

(56) References Cited

U.S. PATENT DOCUMENTS

| | | | | |
|---|---|---|---|---|
| 2004/0256700 | A1* | 12/2004 | Doris ................ | H01L 21/76275 257/627 |
| 2007/0037329 | A1* | 2/2007 | Kelman .......... | H01L 21/823807 438/154 |
| 2011/0278581 | A1* | 11/2011 | Inoue .................... | H01L 21/743 257/66 |

FOREIGN PATENT DOCUMENTS

JP    2011238760 A    11/2011

* cited by examiner

*Primary Examiner* — Daniel Whalen
(74) *Attorney, Agent, or Firm* — Volentine, Whitt & Francos, PLLC

(57) ABSTRACT

A semiconductor device having reduced size, and a manufacturing method of the semiconductor device, where the semiconductor device has a silicon layer provided in a first region on a sapphire substrate, and a silicon device formed on the silicon layer. An oxide semiconductor layer is provided in a second region on the sapphire substrate, and an oxide semiconductor device is formed in the oxide semiconductor layer. The silicon device is connected to the oxide semiconductor device by plural wiring lines formed in a wiring line layer.

16 Claims, 21 Drawing Sheets

SEMICONDUCTOR DEVICE HAVING SILICON DEVICES IN A SILICON LAYER AND OXIDE SEMICONDUCTOR DEVICES IN AN OXIDE SEMICONDUCTOR LAYER OF A SAME CHIP AND SEMICONDUCTOR DEVICE MANUFACTURING METHOD

CROSS-REFERENCE TO RELATED APPLICATION

This application claims priority under 35 USC 119 from Japanese Patent Application No. 2016-121190, filed on Jun. 17, 2016, the disclosure of which is incorporated by reference herein.

BACKGROUND

Technical Field

The present disclosure relates to a semiconductor device and a semiconductor device manufacturing method.

Related Art

Technology in which plural semiconductor elements having different breakdown voltages are formed in a single semiconductor substrate is known. For example, Japanese Patent Application Laid-Open No. 2011-238760 discloses a semiconductor device in which a low voltage element and a high voltage element are provided together in an active layer of a silicon-on-insulator (SOI) substrate. The low voltage element configures a low potential reference circuit section that operates with a first potential as a reference potential. The high voltage element configures a high potential reference circuit section that operates with a second potential as a reference potential. The second potential is a higher potential than the first potential.

Power devices, such as metal-oxide-semiconductor field-effect transistors (MOSFET) and insulated gate bipolar transistors (IGBT) configured by silicon, have increasingly high electric energy conversion efficiencies. However, it has become difficult to make significant improvements, such as, for example, reducing the size of the devices. Further, in a conventional power module having a power device configured by silicon and a control circuit packaged in one chip, the ratio of occupied surface area of a power device in the chip is high (for example, 60% to 90%) and reducing costs by shrinking the chip size has become difficult.

In recent years, power devices employing wide-band-gap materials such as SiC and GaN, which have performances surpassing the performance limits of silicon, have been developed, and performance improvements are progressing rapidly. The ON-resistance of power devices configured by these wide band gap materials is lower than the ON-resistance of power devices configured by silicon. Accordingly, significant reductions to chip size may be possible by configuring power devices with wide band gap materials. However, power devices employing wide band gap materials such as SiC and GaN are what is known as discrete devices, and a technology in which a power device and a control circuit are provided together in one chip, has not been realized. Although discrete power devices configured by wide band gap materials and control circuits configured by silicon could conceivably be configured by separate chips, in such cases, reduction in device scale is not possible, the number of component points increases, and manufacturing processes and management become complicated.

SUMMARY

The present disclosure provides a semiconductor device and a semiconductor device manufacturing method that may further reduce the size thereof.

A first aspect of the present disclosure is a semiconductor device including: a substrate; a silicon layer provided at a first region of a surface of the substrate; and an oxide semiconductor layer provided at a second region of the surface of the substrate, the second region being adjacent to the first region.

A second aspect of the present disclosure is a manufacturing method of a semiconductor device, including: forming a silicon device in a first region of a silicon layer provided on a surface of a substrate; partially exposing the surface of the substrate by removing a second region of the silicon layer, the second region being adjacent to the first region; forming an oxide semiconductor layer on the exposed portion of the substrate; and forming an oxide semiconductor device on the oxide semiconductor layer.

According to the above aspects, the present disclosure may provide a semiconductor device and a semiconductor device manufacturing method that may further reduce the size thereof.

BRIEF DESCRIPTION OF THE DRAWINGS

Exemplary embodiments will be described in detail based on the following figures, wherein.

DETAILED DESCRIPTION

Exemplary embodiments of the present disclosure are described below, with reference to the drawings. Note that in each figure, configuration components and portions that are the same or equivalent are allocated the same reference sign.

First Exemplary Embodiment

Figure 1:
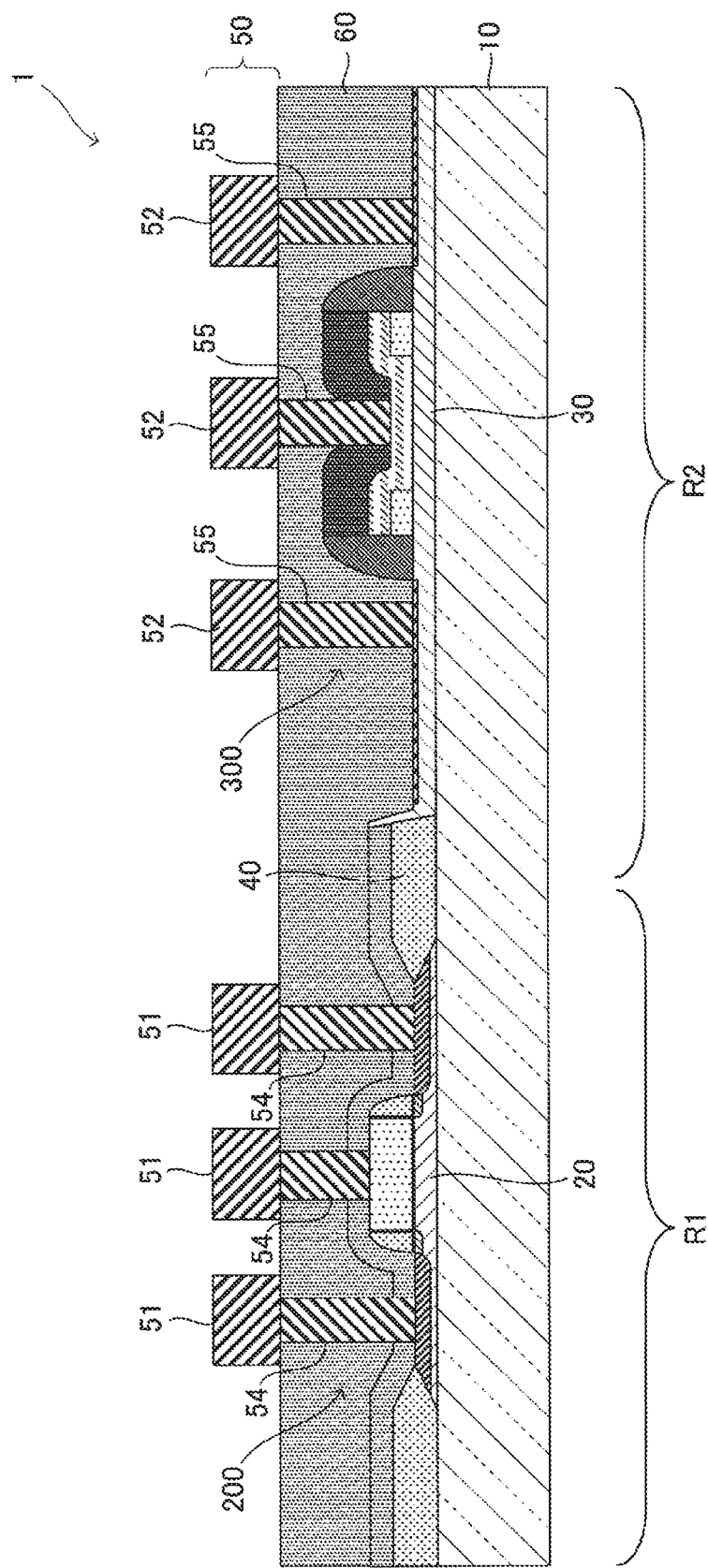
FIG. 1 is a cross-sectional view illustrating a configuration of a semiconductor device 1 according to an exemplary embodiment of the present disclosure.

FIG. 1 is a cross-section illustrating a configuration of a semiconductor device 1 according to the present exemplary embodiment of the present disclosure. The semiconductor device 1 includes a silicon layer 20 provided in a first region R1 on a sapphire substrate 10, and a oxide semiconductor layer 30 provided in a second region R2, which is adjacent to the first region R1, on the sapphire substrate 10. The silicon layer 20 is primarily configured by silicon, and the oxide semiconductor layer 30 is primarily configured by an oxide semiconductor.

Gallium oxide ($Ga_2O_3$), indium oxide ($In_2O_3$), and aluminum oxide ($Al_2O_3$) are examples of oxide semiconductors that configure the oxide semiconductor layer 30. Further, materials in which indium (In) or aluminum (Al) has been added to gallium oxide ($Ga_2O_3$), materials in which gallium (Ga) or aluminum (Al) has been added to indium oxide ($In_2O_3$), and materials in which gallium (Ga) or indium (In) has been added to aluminum oxide ($Al_2O_3$) may also be employed. In the semiconductor device 1 according to the present exemplary embodiment, a typical example of the material configuring the oxide semiconductor layer 30 is gallium oxide ($Ga_2O_3$).

The sapphire substrate 10 and the oxide semiconductor layer 30 both have corundum type crystal structures. A corundum type crystal structure is a structure typically held by $A_2B_3$ ionic crystals, in which, in a foundation of a hexagonal close-packed structure of oxygen atoms, metal atoms are introduced into two thirds of the gaps at the octahedra coordination sites between the oxygen atoms, and the other third remains hollow. Since the sapphire substrate 10 and the oxide semiconductor layer 30 have the same crystal structure, it is possible to form the oxide semiconductor layer 30 on the sapphire substrate 10 by employing a film formation method that employs crystal growth such as mist chemical vapor deposition (CVD).

The silicon layer 20 and the oxide semiconductor layer 30 are insulated and separated from each other by an insulating-separating film 40 configured by an insulator such as silicon oxide ($SiO_2$), provided between the silicon layer 20 and the oxide semiconductor layer 30. An oxide semiconductor device 300 configured including an oxide semiconductor is provided to the oxide semiconductor layer 30. The oxide semiconductor device 300 is, for example, a power device such as a power transistor. On the other hand, a silicon device 200 configured including silicon is provided to the silicon layer 20. The silicon device 200 may, for example, be a circuit element such as a transistor, a resistor element, or a capacitor configuring a control circuit that controls the oxide semiconductor device 300.

The semiconductor device 1 includes a wiring line layer 50 including wiring lines 51 connected to the silicon device 200 and wiring lines 52 connected to the oxide semiconductor device 300. The wiring line layer 50 is formed on an insulating film 60 that covers the silicon device 200 and the oxide semiconductor device 300. The wiring line layer 50 may have a multi-layer wiring line structure formed across plural layers. The wiring lines 51 are connected to the silicon device 200 by vias 54 that pass through the insulating film 60 to reach the silicon device 200. The wiring lines 52 are connected to the oxide semiconductor device 300 by vias 55 that pass through the insulating film 60 to reach the oxide semiconductor device 300. The silicon device 200 can be electrically connected to the oxide semiconductor device 300 by connecting the wiring lines 51 to the wiring lines 52. Accordingly, for example, operation of the oxide semiconductor device 300 can be controlled by a control circuit configured by the silicon device 200. Further, in cases in which the oxide semiconductor device 300 is configured as a power device, a power device and a power module including a control circuit that controls the power device can be configured by a single chip.

Figure 2:
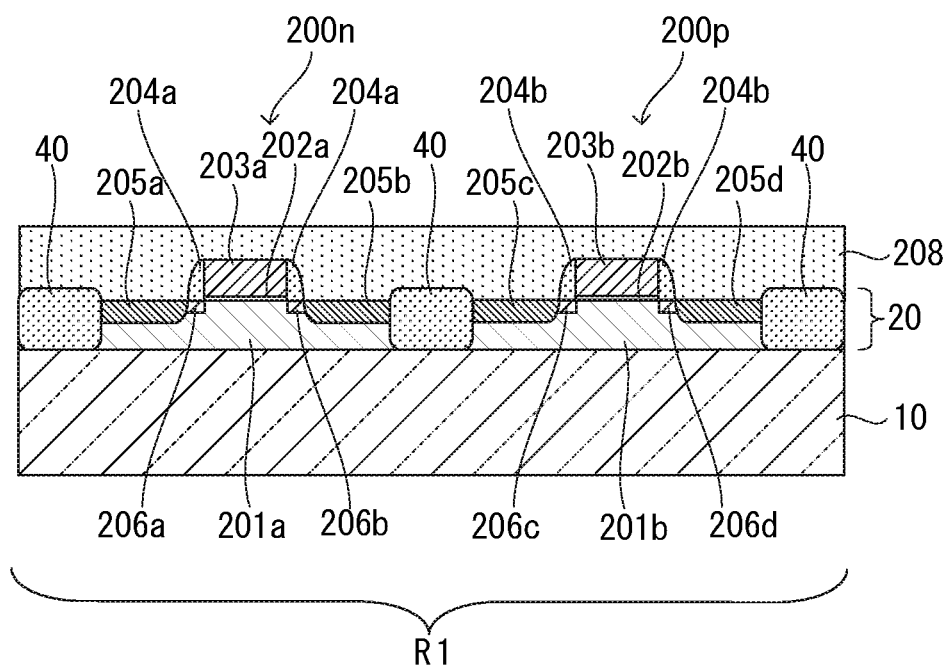
FIG. 2 is a cross-sectional view illustrating a silicon device formed in a silicon layer according to an exemplary embodiment of the present disclosure.

FIG. 2 is a cross-section illustrating a specific example of a silicon device formed to the silicon layer 20 in the first region R1 on the sapphire substrate 10. The sapphire substrate 10 is a C-plane sapphire substrate of approximately 600 μm thickness. The silicon layer 20, which is configured by <100> oriented monocrystalline silicon and has a thickness of approximately 150 nm, is provided on the surface of the sapphire substrate. Note that a silicon oxide film ($SiO_2$ film) that functions as a buffer layer for relaxing lattice irregularities between the sapphire substrate 10 and the silicon layer 20 may be provided between the sapphire substrate 10 and the silicon layer 20. FIG. 2 illustrates an n-channel MOSFET 200n and a p-channel MOSFET 200p that configure a CMOS circuit as an example of a silicon device.

The n-channel MOSFET 200n includes a p-type body portion 201a having a carrier density of from approximately $1 \times 10^{15}/cm^3$ to approximately $1 \times 10^{16}/cm^3$, and a gate 203a formed through a gate insulating film 202a on the body portion 201a. The gate insulating film 202a is, for example, configured by silicon oxide ($SiO_2$), and the gate 203a is, for example, configured by polysilicon doped with n-type impurities. Side faces of the gate 203a are covered by side walls 204a configured by an insulator, such as silicon nitride ($Si_3N_4$). At a surface layer portion of the body portion 201a, an n-type source 205a and an n-type drain 205b are provided with the gate 203a interposed therebetween. The carrier densities of the source 205a and the drain 205b are, for example, approximately $1 \times 10^{20}/cm^3$. An n-type lightly doped drain (LDD) 206a is provided adjacent to the source 205a, and an n-type LDD 206b is provided adjacent to the drain 205b. The carrier densities of the LDDs 206a and 206b are lower than the carrier densities of the source 205a and the drain 205b, and the LDDs 206a and 206b are disposed directly below the side walls 204a.

The p-channel MOSFET 200p includes an n-type body portion 201b having a slightly higher carrier density than the p-type body portion 201a, and a gate 203b formed across a gate insulating film 202b on the body portion 201b. The gate insulating film 202b is, for example, configured by silicon oxide ($SiO_2$), and the gate 203b is, for example, configured by polysilicon doped with an n-type impurity. Side faces of the gate 203b are covered by side walls 204b configured by an insulator such as silicon nitride ($Si_3N_4$). A p-type source 205c and a p-type drain 205d are provided in the surface layer portion of the body portion 201b such that the gate 203b is interposed therebetween. A p-type LDD 206c is provided adjacent to the source 205c and a p-type LDD 206d is provided adjacent to the drain 205d. The carrier densities of the LDDs 206c and 206d are both lower than the carrier densities of the source 205c and the drain 205d respectively, and the LDDs 206c and 206d are disposed directly below the side walls 204b.

The n-channel MOSFET 200n and the p-channel MOSFET 200p are insulated and separated from other adjacent elements by the insulating-separating film 40. The n-channel MOSFET 200n and the p-channel MOSFET 200p are covered by an insulating film 208 configured by an insulator such as silicon oxide ($SiO_2$). Although not illustrated in FIG. 2, respective wiring lines are connected to the gate 203a, the source 205a, and the drain 205b of the n-channel MOSFET 200n, and the gate 203b, the source 205c, and the drain 205d of the p-channel MOSFET 200p.

Other examples of silicon devices formed to the silicon layer 20 in the first region R1 on the sapphire substrate 10 include: active elements such as lateral bipolar transistors such as a PNP transistor and an NPN transistor, or diodes; and passive elements such as resistor elements or capacitors. An $N^+/P$ diode, an $N/P^+$ diode, an N/P diode, and an $N^+/P^+$ Zener diode employing a high carrier density region and a low carrier density region can be formed as diodes. An $N^+$ resistor, a $P^+$ resistor, an N-well resistor, or a P-well resistor can be formed as a resistor element. Further, an LR resistor having a relatively low sheet resistance value formed by injecting impurities into polysilicon at a high dose, and a HR resistor having a relatively high sheet resistance value formed by injecting impurities into polysilicon at a low dose, can be formed as resistor elements. An NMOS capacitor and a PMOS capacitor can be formed as capacitors.

As described above, various types of active elements and passive elements can be formed as silicon devices in the silicon layer 20 provided in the first region R1 on the sapphire substrate 10, and combinations thereof enable integrated circuits including logical circuits and analog circuits to be configured. Although forming circuit elements that typically have low breakdown voltages (up to 5 V) in the silicon layer 20 is envisaged, the impurity concentrations and the dimensions of each region can be adjusted in cases in which a circuit element having an intermediate breakdown voltage (from 7 V to 30 V) is required. In such cases, these may be introduced by adding a dedicated photolithographic process and ion implantation process if necessary.

Figure 3A:
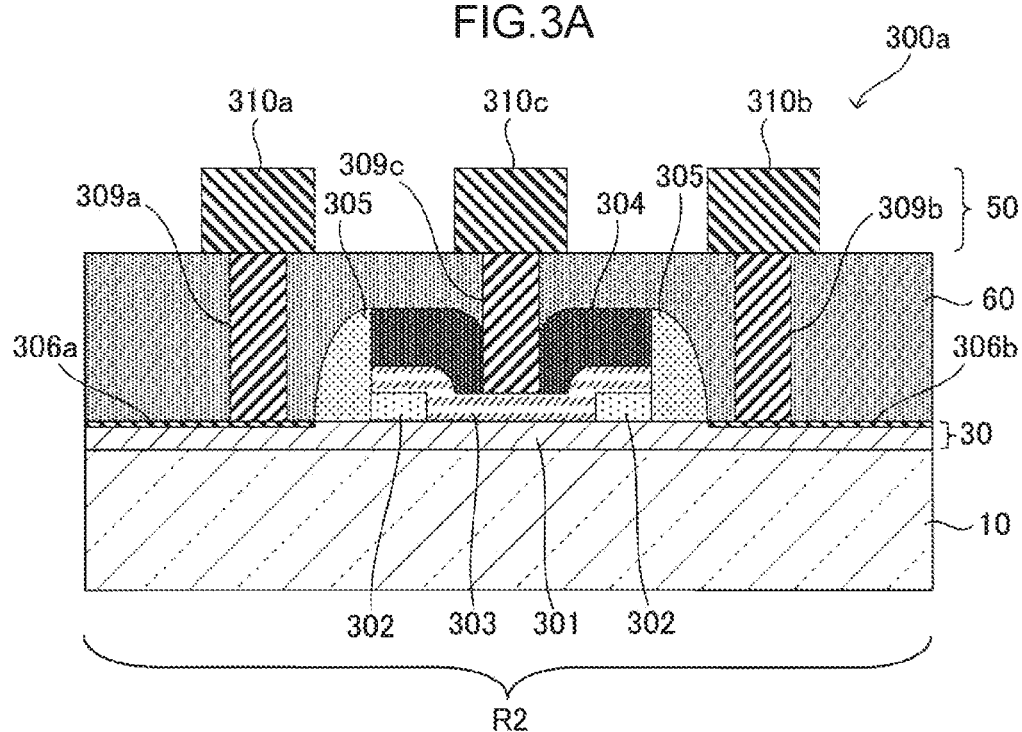
FIG. 3A to FIG. 3C are cross-sectional views illustrating examples of oxide semiconductor devices formed in an oxide semiconductor layer according to an exemplary embodiment of the present disclosure.

FIG. 3A is a cross-sectional view illustrating an example of an oxide semiconductor device formed to the oxide semiconductor layer 30 in the second region R2 on the sapphire substrate 10. FIG. 3A illustrates an n-channel metal-semiconductor field effect transistor (MESFET) 300a as an example of an oxide semiconductor device.

The MESFET 300a includes a body portion 301 formed in the oxide semiconductor layer 30. The body portion 301 is, for example, configured by a monocrystalline gallium oxide semiconductor having a corundum structure doped with tin (Sn), which is an n-type impurity, at a concentration of approximately $1\times10^{17}/cm^3$. An insulating film 302 having a thickness of approximately 200 nm configured by an insulator such as silicon oxide ($SiO_2$) is provided on the surface of the body portion 301. The insulating film 302 is patterned so that an opening is formed, and a gate 303 configured by conductor such as $AgO_x$ is embedded in this opening. The gate 303 contacts the body portion 301 and a Schottky barrier is formed between the gate 303 and the body portion 301. The surface of the gate 303 is covered by an insulating film 304 configured by an insulator such as silicon nitride ($Si_3N_4$). Side faces of a layered body formed by the insulating film 302, the gate 303, and the insulating film 304 are covered by side walls 305 configured by an insulator such as silicon nitride ($Si_3N_4$). A source 306a and a drain 306b are provided in the surface of the body portion 301 such that the gate 303 is interposed between the source 306a and the drain 306b. The source 306a and the drain 306b are configured by a metal material such as titanium (Ti), which can form an ohmic contact with the oxide semiconductor layer 30.

The gate 303 covered by the insulating film 304, the source 306a, and the drain 306b are covered by the insulating film 60, which is configured by an insulator such as silicon oxide ($SiO_2$). A source wiring line 310a connected to the source 306a through a via 309a, a drain wiring line 310b connected to the drain 306b through a via 309b, and a gate wiring line 310c connected to the gate 303 through a via 309c are formed in the wiring line layer 50 formed on the insulating film 60. A source wiring line 310a, a drain wiring line 310b, and a gate wiring line 310c are, for example, configured by a conductor such as aluminum (Al) or an aluminum alloy. The vias 309a, 309b, and 309c are, for example, formed by embedding layered films of titanium (Ti) and tungsten (W) inside a contact hole formed in the insulating film 60.

The MESFET 300a is a normally-ON device, and the magnitude of current flowing between the source 306a and the drain 306b can be controlled by changing the size of a depletion region formed in the body portion 301 by applying a voltage to the gate 303. The MESFET 300a has a low gate input impedance and a large gate leak current compared to a MOSFET, but has excellent high speed operation characteristics.

Figure 3B:
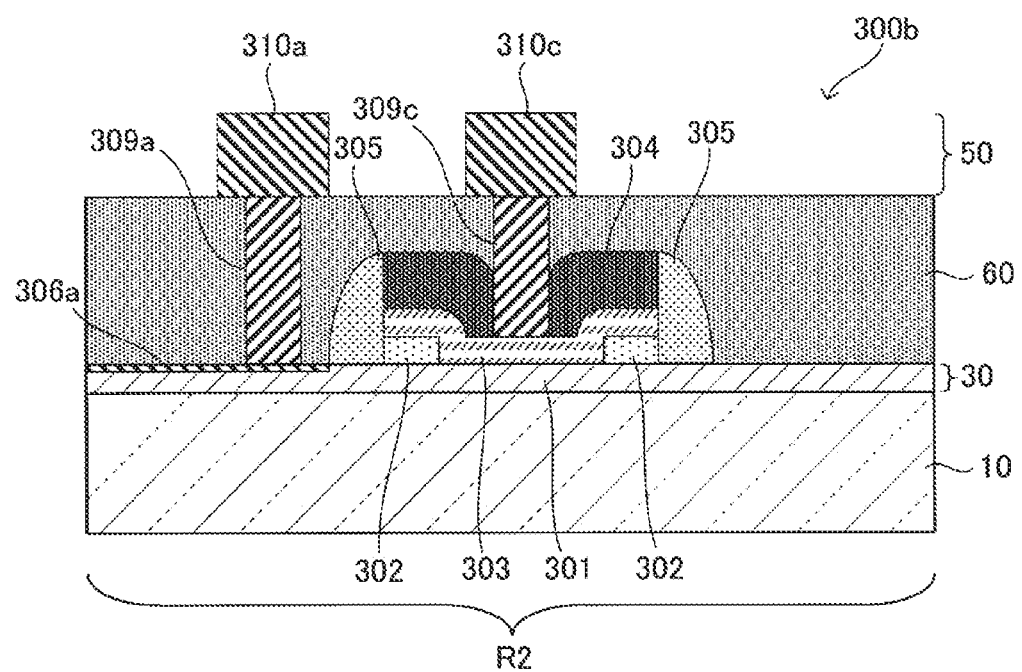

FIG. 3B is a cross-sectional view illustrating an example of an oxide semiconductor device formed in the oxide semiconductor layer 30 in the second region R2 on the sapphire substrate 10. FIG. 3B illustrates a Schottky barrier diode (SBD) 300b as alternative example of an oxide semiconductor device. The SBD 300b is a Schottky barrier formed between the gate 303 and the body portion 301 of the MESFET 300a illustrated in FIG. 3A, and can employ the gate 303 as an anode and the source 306a or the drain 306b as a cathode.

Figure 3C:
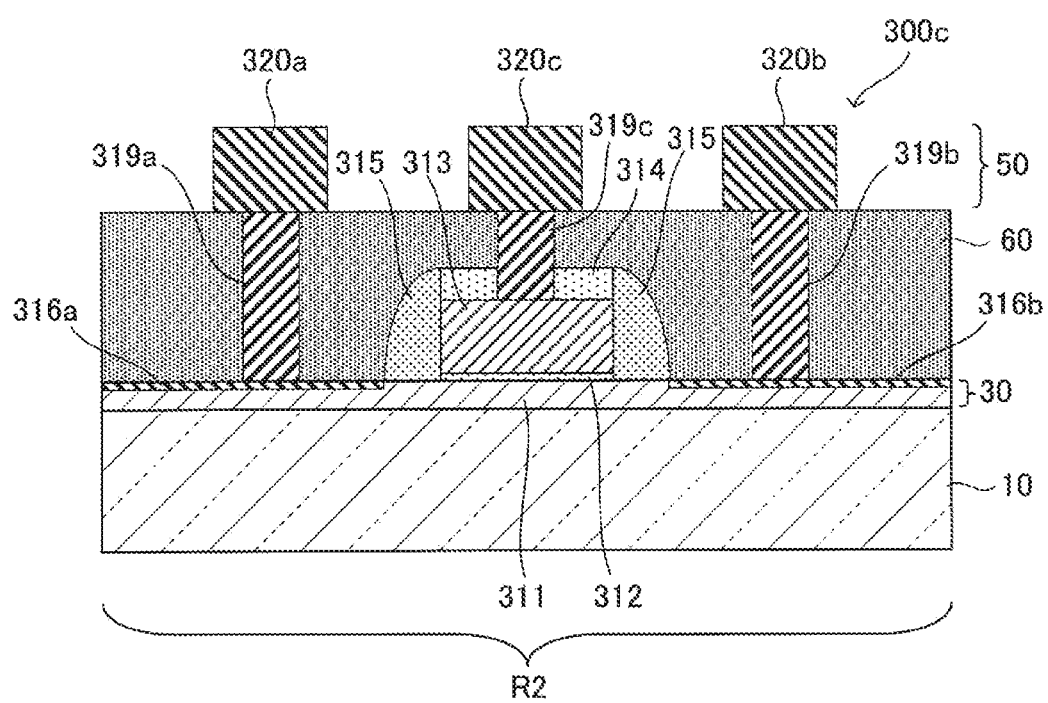

FIG. 3C is a cross-sectional view illustrating an example of an oxide semiconductor device formed in the oxide semiconductor layer 30 in the second region R2 on the sapphire substrate 10. FIG. 3C illustrates a MOSFET 300c as alternative example of an oxide semiconductor device.

The MOSFET 300c includes a body portion 311 formed in the oxide semiconductor layer 30. The body portion 311 is, for example, configured by a monocrystalline gallium oxide semiconductor having a corundum type structure that includes tin (Sn), which is an n-type impurity, at a carrier density of $1\times10^{15}/cm^3$ or less. A gate 313 configured by a conductor such as $AgO_x$ is provided on the surface of the body portion 301 with a gate insulating film 312 configured by an insulator such as $Al_2O_3$ interposed between the gate 313 and the surface.

The surface of the gate 313 is covered by an insulating film 314 configured by an insulator such as silicon oxide ($SiO_2$). Side faces of a layered body formed from the gate insulating film 312, the gate 313, and the insulating film 314 are covered by side walls 315 configured by an insulator such as silicon nitride ($Si_3N_4$). A source 316a and a drain 316b are provided in the surface of the body portion 311 such that the gate 313 is interposed between the source 316a and the drain 316b. The source 316a and the drain 316b are configured by a metal material such as Ti, which is capable of forming an ohmic contact with the oxide semiconductor layer 30.

The gate 313 covered by the insulating film 314, the source 316a, and the drain 316b are covered by the insulating film 60 configured by an insulator such as silicon oxide ($SiO_2$). A source wiring line 320a connected to the source 316a through a via 319a, a drain wiring line 320b connected to the drain 316b through a via 319b, and a gate wiring line 320c connected to the gate 313 through a via 319c are formed in the wiring line layer 50 formed on the insulating film 60. The source wiring line 320a, the drain wiring line 320b, and the gate wiring line 320c are, for example, configured by a conductor such as aluminum (Al) or an aluminum alloy. The vias 319a, 319b, and 319c are, for example, formed by embedding layered films of titanium (Ti) and tungsten (W) inside a contact hole formed in the insulating film 60.

The MOSFET 300c forms a current path between the source 316a and the drain 316b by applying a voltage to the gate 313, and enters an ON state. The MOSFET 300c has a high gate input impedance and a small gate leak current compared to a MESFET.

An SBD having the gate 313 as an anode and the source 316a or the drain 316b as a cathode can be configured by removing the gate insulating film 312 of the MOSFET 300c, placing the gate 313 in contact with the body portion 311, and forming a Schottky barrier between the gate 313 and the body portion 311. In such cases, the gate 313 is preferably configured by Au or AuPt.

In the above, examples of oxide semiconductor devices formed in the oxide semiconductor layer 30 have been explained. However, plural oxide semiconductor devices may be formed in the oxide semiconductor layer 30, and the plural oxide semiconductor devices may be connected by wiring lines formed in wiring line layer 50.

Figure 4:
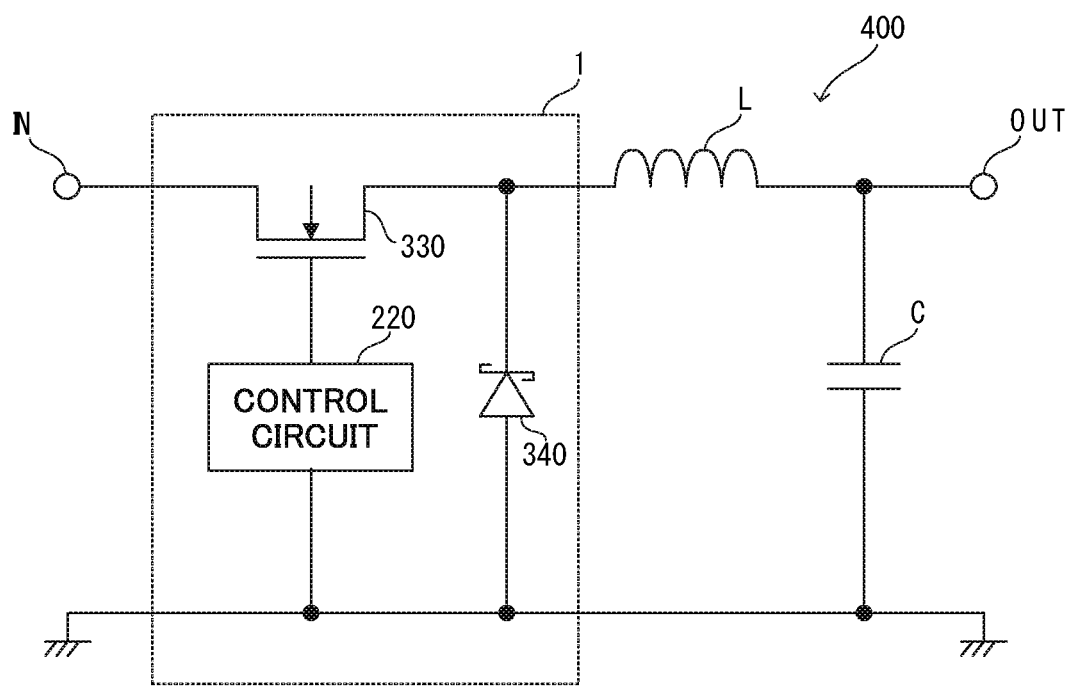
FIG. 4 is a diagram illustrating a system configured including a semiconductor device according to an exemplary embodiment of the present disclosure.

FIG. 4 is a diagram illustrating a system configured including the semiconductor device 1 according to the present exemplary embodiment of the present disclosure. FIG. 4 illustrates a step-down DC-DC converter 400 as an example of a system configured including the semiconductor device 1. The DC-DC converter 400 is configured including the semiconductor device 1, an inductor L, and a capacitor C. The DC-DC converter 400 steps down a DC voltage input to an input terminal IN to a predetermined voltage level, and outputs the stepped down voltage from an output terminal OUT.

The semiconductor device 1 includes a control circuit 220 configured by a silicon device formed in the silicon layer 20, and a power transistor 330 and diode 340 serving as oxide semiconductor devices formed in the oxide semiconductor layer 30. The MESFET 300a illustrated in FIG. 3A or the MOSFET 300c illustrated in FIG. 3C may be applied as the power transistor 330. Further, the SBD 300b illustrated in FIG. 3B may be applied as the diode 340. The control circuit 220, the power transistor 330, and the diode 340 are connected to one another by wiring lines formed in the wiring line layer 50 (see FIG. 1).

The control circuit 220 controls the ON/OFF states of the power transistor 330 by supplying a pulse width modulation (PWM) signal to the gate of the power transistor 330. The output voltage output from the output terminal OUT is adjusted using the duty cycle of the PWM signal. The diode 340 forms a path of current flowing to the inductor L when the power transistor 330 is OFF.

As illustrated in FIG. 4, the semiconductor device 1 according to the present exemplary embodiment enables a power module including a power device formed in the oxide semiconductor layer 30 and a control circuit formed in the silicon layer 20 to be configured by a single chip. FIG. 4 illustrates a case in which the semiconductor device 1 is used to configure a DC-DC converter. However, for example, the semiconductor device 1 could also be used to configure a motor driver or an LED driver.

Figure 5:
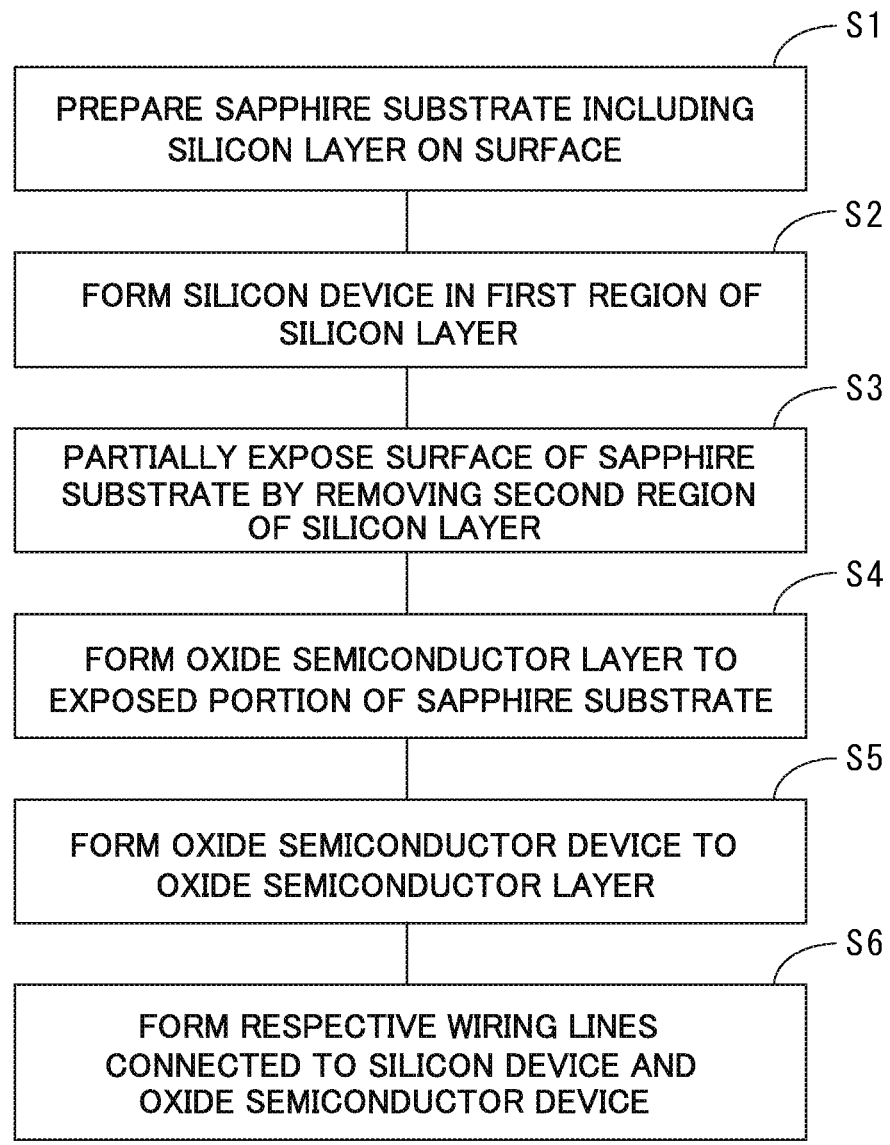
FIG. 5 is a process flowchart illustrating a manufacturing method of a semiconductor device according to an exemplary embodiment of the present disclosure.

A manufacturing method of the semiconductor device 1 according to the present exemplary embodiment of the present disclosure is described below. First, a general flow of the manufacturing method of the semiconductor device 1 of the present exemplary embodiment of the present disclosure is described with reference to the process flowchart illustrated in FIG. 5.

In step S1, a sapphire substrate including a silicon layer on the surface is prepared. In step S2, a silicon device such as a CMOS circuit, like that illustrated in FIG. 2 for example, is formed to the first region of the silicon layer. In step S3, the surface of the sapphire substrate is partially exposed by removing the second region of the silicon layer, the second region being adjacent to the first region. In step S4, an oxide semiconductor layer is formed to the exposed portion of the sapphire substrate. In step S5, an oxide semiconductor device, like those illustrated in FIG. 3A to FIG. 3C, for example, is formed to the oxide semiconductor layer. In step S6, respective wiring lines are formed connected to the silicon device and the oxide semiconductor device.

Figure 6A:
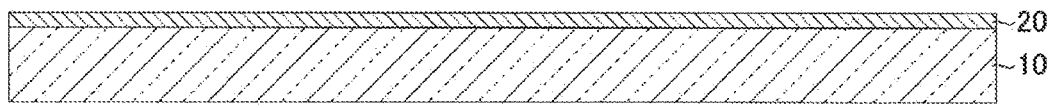
FIG. 6A to FIG. 6S are cross-sectional views illustrating a manufacturing method of a semiconductor device according to an exemplary embodiment of the present disclosure.

An example of a manufacturing method of the semiconductor device 1 is described below, with reference to FIG. 6A to FIG. 6S. In the following description, an example is given of a case in which an n-channel MOSFET is formed in a silicon layer and an n-channel MESFET is formed in an oxide semiconductor layer.

First, a silicon on sapphire (SOS) substrate is prepared. The SOS substrate is formed from a silicon layer 20 of approximately 150 nm thickness configured by monocrystalline silicon on the sapphire substrate 10, which has a C-plane orientation and thickness of approximately 600 μm (FIG. 6A). The silicon layer 20 has p-type conductivity and the carrier density is from approximately $1 \times 10^{15}/cm^3$ to approximately $1 \times 10^{16}/cm^3$. A buffer layer (not illustrated) having a thickness of approximately 50 nm configured by silicon oxide ($SiO_2$) is interposed between the sapphire substrate 10 and the silicon layer 20. In the present exemplary embodiment, the SOS substrate is a starting material. Note that, known wafer bonding technologies, polishing technologies, smart cut technologies, or the like may be employed to manufacture the SOS substrate.

Figure 6B:
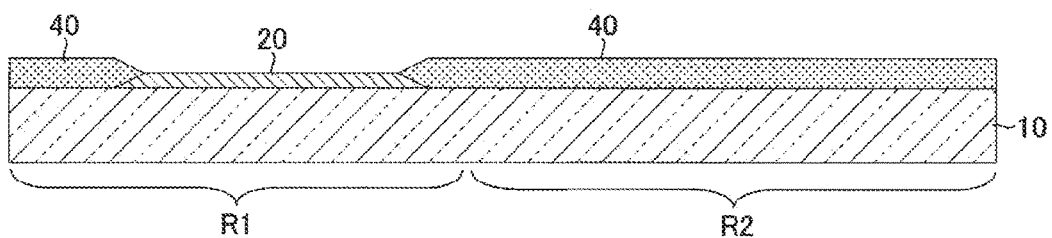

Next, a known local oxidation of silicon (LOCOS) method is used to form the insulating-separating film 40 configured by an insulator such as silicon oxide ($SiO_2$) at a predetermined portion of the silicon layer 20 (FIG. 6B). The insulating-separating film 40 is formed in the first region R1 on the sapphire substrate 10 in regions where there is inter-silicon device insulation and separation. Further, the insulating-separating film 40 is formed in the second region R2 on the sapphire substrate 10 where the oxide semiconductor layer will be formed. The LOCOS method is a method in which a thermal pad-oxide film and a silicon nitride film are stacked on the surface of the silicon layer 20, the silicon nitride film is patterned using photolithography technology and etching technology, and a silicon region in the exposed portion of the thermal pad-oxide film is selectively, thermally oxidized.

Figure 6C:
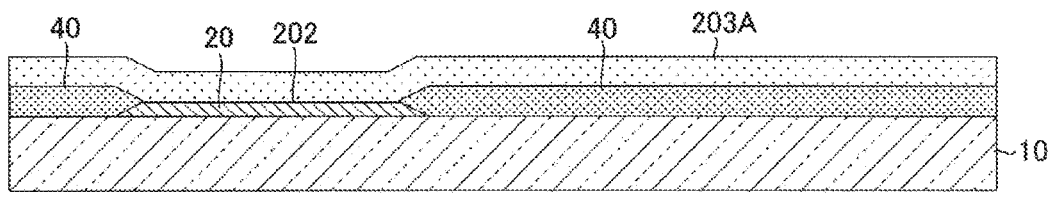

Next, a gate insulating film 202 having a thickness of approximately 15 nm is formed by thermally oxidizing the surface of the silicon layer 20. Next, ion implantation is performed to adjust the carrier density of the silicon layer 20 surface and a threshold voltage Vt of the MOSFET is adjusted, if necessary. Subsequently, a known CVD method is used to form a polysilicon film 203A having a thickness of approximately 200 nm, covering the entire surface of the silicon layer 20 and the insulating-separating film 40 (FIG. 6C).

Next, known ion implantation technology is used to inject phosphorous into the overall surface of the polysilicon film 203A at a low dose. Subsequently, photolithography technology is used to form a resist pattern on the polysilicon film 203A, and phosphorous or arsenic is injected into the polysilicon film 203A at a high dose as a mask for the resist pattern. This treatment forms a low resistance region having a sheet resistance value of approximately 100Ω/□ and a high resistance region having a sheet resistance value of approximately 2000Ω/□ in the polysilicon film 203A.

Figure 6D:
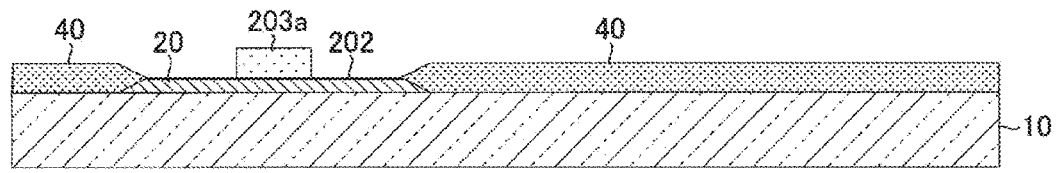

Next, using known photolithography technology and etching technology, the polysilicon film 203A is patterned and a gate 203a is formed from the low resistance region of the polysilicon film 203A (FIG. 6D). Further, the low resistance region and the high resistance region of the polysilicon film 203A are suitably employed as resistor elements.

Figure 6E:
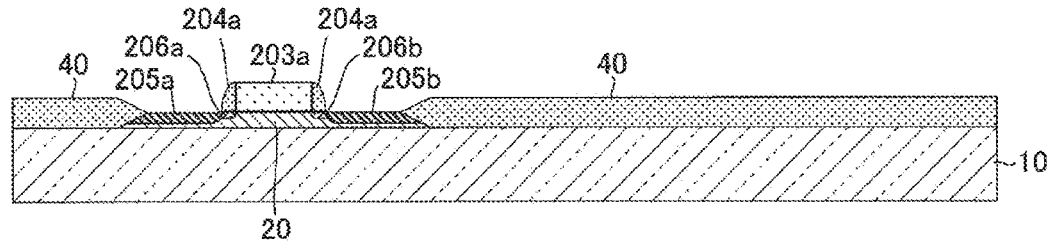

Next, arsenic is injected into a surface layer portion of the silicon layer 20 at a low dose using known photolithography technology and ion implantation technology, thereby forming the LDDs 206a and 206b. Next, a known CVD method is used to form an insulating film configured by an insulator such as silicon nitride ($Si_3N_4$) having a thickness of approximately 100 nm that covers the entire surface of the silicon layer 20 and the insulating-separating film 40, and the insulating film is etched using known anisotropic etching technology to form the side walls 204a that cover the side faces of the gate 203a. Next, known photolithography technology and ion implantation technology is used to inject arsenic into the surface layer portion of the silicon layer 20 at a high dose, and the source 205a and the drain 205b are formed. In the ion implantation, the gate 203a and the side walls 204a function as a portion of the mask, and the source 205a and the drain 205b are formed by self-alignment with respect to the gate 203a and the LDDs 206a and 206b (FIG. 6E).

Figure 6F:
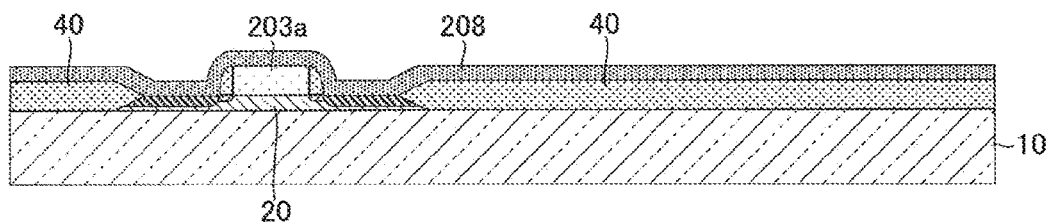

Next, known CVD technology is used to form the first insulating film 208, which has a thickness of approximately 150 nm, from an insulator such as silicon oxide ($SiO_2$) so as to entirely cover the silicon layer 20, the insulating-separating film 40, and the gate 203a (FIG. 6F).

A silicon device is formed to the silicon layer 20 on the sapphire substrate 10 by the processes above. Note that, a heat treatment process may be added as appropriate for the sake of activation and defect recovery of the crystal layer and optimization of the impurity profile. Further, although a case in which an n-channel MOSFET is formed as the silicon device was described above, another active element such as a p-channel MOSFET, an NPN transistor, or a PNP transistor, and a passive element such as a resistor element or a capacitor could also be formed as the silicon devices formed in the silicon layer 20.

Figure 6G:
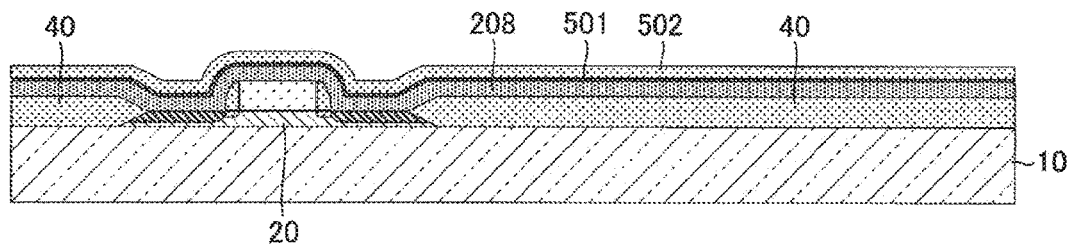

After forming the silicon device in the silicon layer 20, a stopper film 501 and a sacrificial film 502 are formed on the insulating film 208 prior to forming the oxide semiconductor layer on the first sapphire substrate 10 (FIG. 6G). As described later, the oxide semiconductor layer is formed by partially exposing the surface of the sapphire substrate 10, and then growing a crystal of an oxide semiconductor such as gallium oxide ($Ga_2O_3$) on the exposed portion of the sapphire substrate 10. When doing so, there is a chance that oxide semiconductor could also be deposited on the surface of the first insulating film 208 that covers the silicon layer 20. In cases in which oxide semiconductor has been deposited on the surface of the first insulating film 208, an opening defect may occur when forming a contact hole in the first insulating film 208 in a subsequent process, and this may result in operational defects in the silicon device. In the manufacturing method according to the present exemplary embodiment, depositing of oxide semiconductor on the first insulating film 208 is prevented using a lift-off method that employs the stopper film 501 and the sacrificial film 502. The stopper film 501 is, for example, configured by silicon nitride ($Si_3N_4$), the sacrificial film 502 is, for example, configured by silicon oxide ($SiO_2$), and these films are formed using a known CVD method.

Figure 6H:
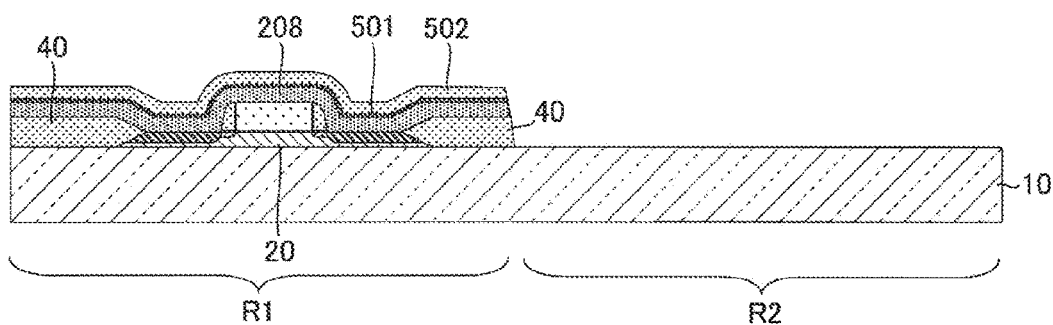

Next, in the second region R2 on the sapphire substrate 10, known etching technology is used to remove the sacrificial film 502, the stopper film 501, the first insulating film 208, and the insulating-separating film 40, thereby partially exposing the surface of the sapphire substrate 10 (FIG. 6H).

Figure 6I:
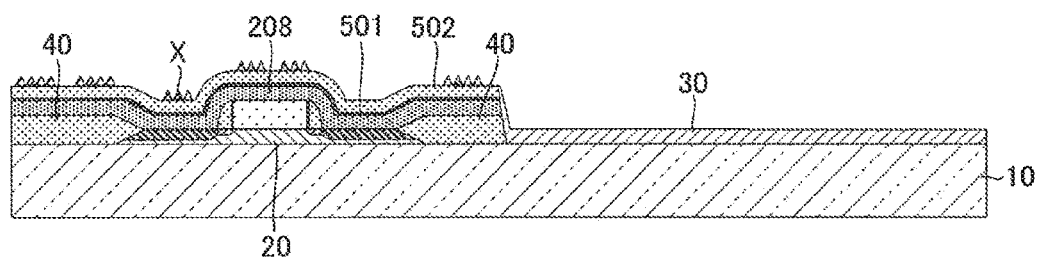

Next, a known mist CVD method is used to form the oxide semiconductor layer 30, which is configured by a single corundum type crystal of gallium oxide, on the exposed portion of the sapphire substrate 10 (FIG. 6I). The mist CVD method is a method that includes converting a solution of film-forming material into a mist-form using ultrasonic vibration or the like, introducing the mist into a reaction oven using a carrier gas such as oxygen, nitrogen, or air, and forming a thin film on the target material for film forming by causing thermal decomposition reactions and chemical reactions to occur. From the viewpoint of suppressing characteristic fluctuations of silicon devices formed in the silicon layer 20, the temperature inside the reaction oven is preferably 500° C. or lower. Further, the carrier density of the oxide semiconductor layer 30 is set to approximately $1 \times 10^{17}/cm^3$ by adding Sn to the film-forming material as an impurity. Oxide semiconductor X also deposits on the sacrificial film 502 that covers the silicon layer 20 (silicon device) due to surplus film-forming material of the oxide semiconductor inside the reaction oven.

Figure 6J:
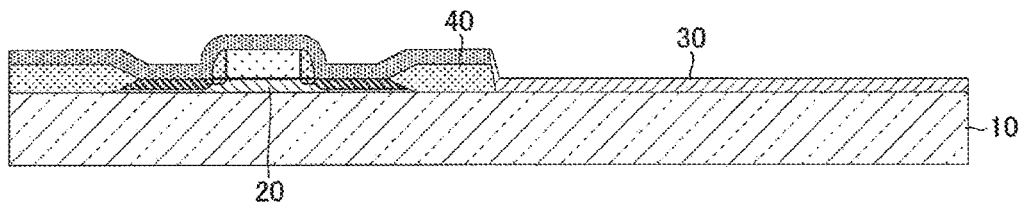

Next, known etching technology is used to remove the sacrificial film 502 together with the oxide semiconductor X deposited on the surface of the sacrificial film 502. For example, hydrofluoric acid (HF) may be employed as the etchant when etching the sacrificial film 502 configured by silicon oxide ($SiO_2$). Since the stopper film 501 configured by silicon nitride ($Si_3N_4$) is etched by hydrofluoric acid at a sufficiently lower rate than the sacrificial film 502, the stopper film 501 is not etched and the first insulating film 208 below the stopper film 501 is protected. Then, the stopper film 501 is removed using known etching technology. For example, hot phosphoric acid ($H_3PO_4$) may be employed as the as the etchant when etching the stopper film 501 configured by silicon nitride ($Si_3N_4$) (FIG. 6J).

Figure 6K:
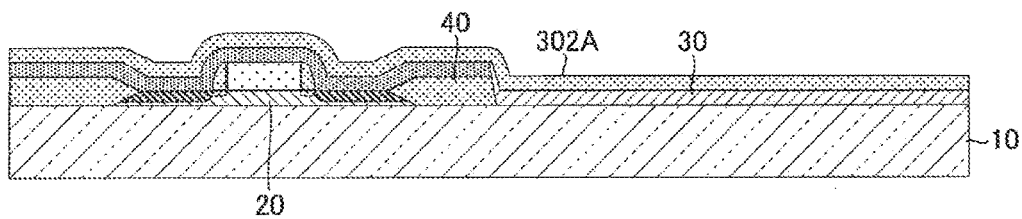

Next, a known CVD method is used to form an insulating film 302A that has a thickness of approximately 500 nm and is configured by an insulator such as silicon oxide ($SiO_2$) so as to cover the entire surface of the first insulating film 208 and the oxide semiconductor layer 30. Note that the insulating film 302A can also be configured by $Al_2O_3$ formed using a mist CVD method (FIG. 6K).

Figure 6L:
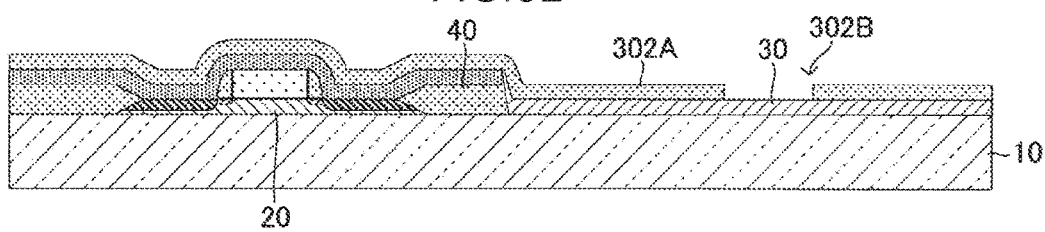

Next, known photolithography technology and etching technology are used to partially remove the insulating film 302A and form an opening portion 302B, and to expose the surface of the oxide semiconductor layer 30 at the opening portion 302B (FIG. 6L). The formation position of the opening portion 302B corresponds to the gate formation position of the MESFET.

Figure 6M:
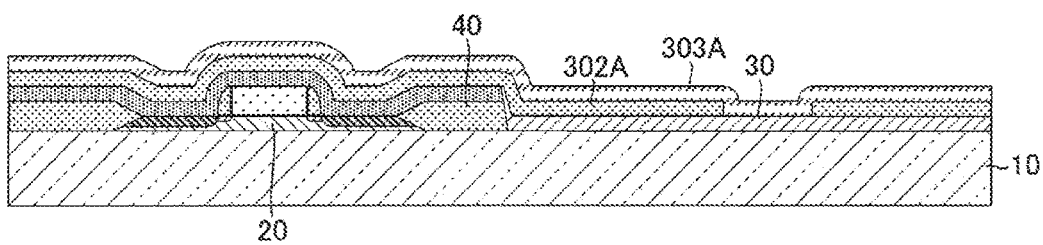

Next, a known vapor deposition method or sputtering method is used to form a conductive film 303A having a thickness of approximately 400 nm configured by a conductor such as AgO$_x$ so as to cover the entire surface of the insulating film 302A. The conductive film 303A buries the opening portion 302B of the insulating film 302A and contacts the oxide semiconductor layer 30 at the formation position of the opening portion 302B. A Schottky barrier is formed between the conductive film 303A and the oxide semiconductor layer 30 (FIG. 6M).

Figure 6N:
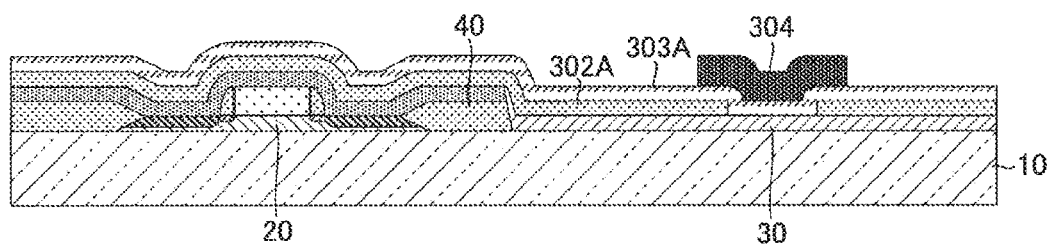

Then, a known CVD method is used to form the insulating film 304 configured by an insulator such as silicon nitride (Si$_3$N$_4$) so as to cover the entire surface of the conductive film 303A, and a hard mask is formed by the insulating film 304 at the gate formation position of the MESFET by patterning the insulating film 304 (FIG. 6N). Note that from the viewpoint of suppressing characteristic fluctuations of silicon devices formed in the silicon layer 20, the film formation temperature of the insulating film 304 is preferably 500° C. or lower.

Figure 6O:
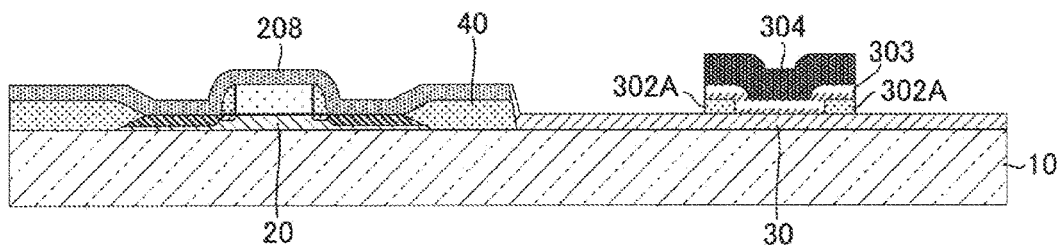

Next, the gate 303 is formed by the conductive film 303A on the oxide semiconductor layer 30 by sequentially etching the conductive film 303A and the insulating film 302A with the insulating film 304 serving as a mask (FIG. 6O).

Figure 6P:
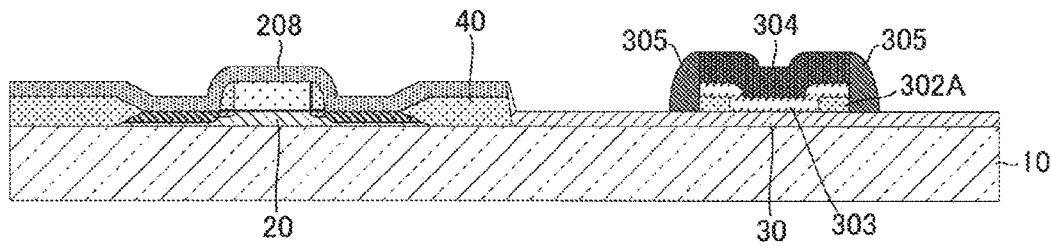

Next, a known CVD method is used to form an insulating film configured by an insulator such as silicon nitride (Si$_3$N$_4$) having a thickness of approximately 150 nm that covers the entire surface of the sapphire substrate 10. Then, the insulating film is etched using anisotropic etching, thereby forming the side walls 305 that cover the side faces of a layered body formed from the insulating film 302A, the gate 303, and the insulating film 304 (FIG. 6P).

Figure 6Q:
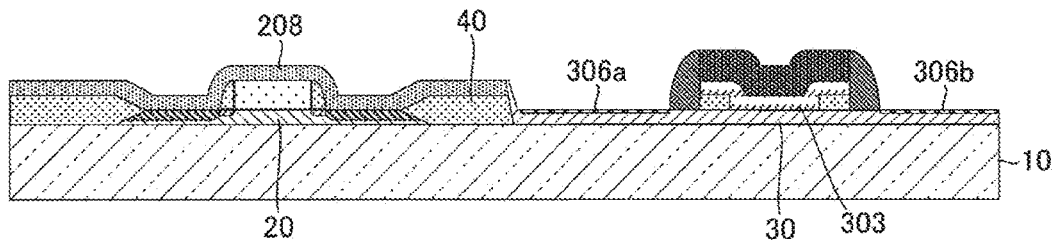

Next, a known sputtering method is used to deposit a metal such as titanium (Ti), which is capable of forming an ohmic contact with the oxide semiconductor layer 30, at positions that interpose the gate 303 of the surface of the oxide semiconductor layer 30, and the source 306a and the drain 306b are thereby formed (FIG. 6Q).

Next, a known CVD method is used to form the second insulating film 60 having a thickness of approximately 1200 nm configured by an insulator such as silicon oxide (SiO$_2$) on the entire surface of the sapphire substrate 10. Then, the surface of the second insulating film 60 is planarized using known CMP technology. The thickness of the second insulating film 60 after planarization is, for example, approximately 800 nm.

Next, known photolithography technology and etching technology are used to form contact holes that respectively reach from the surface of the second insulating film 60 to the source 205a, the drain 205b, and the gate 203a of the MOSFET formed in the silicon layer 20, and to also form contact holes that respectively reach from the surface of the second insulating film 60 to the source 306a, the drain 306b, and the gate 303 of the MESFET formed in the oxide semiconductor layer 30.

Figure 6R:
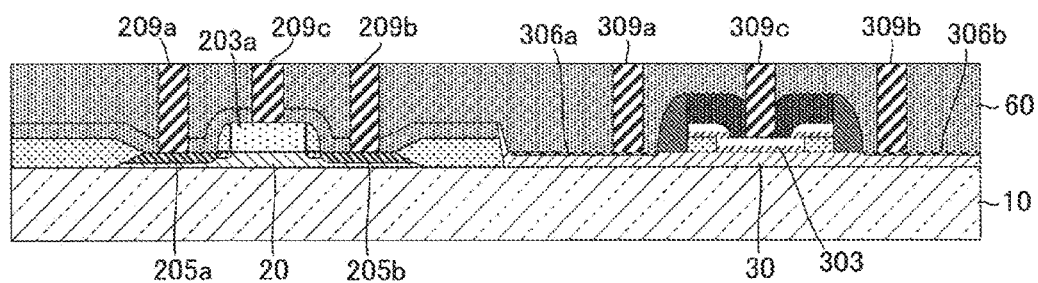
Figure 6S:
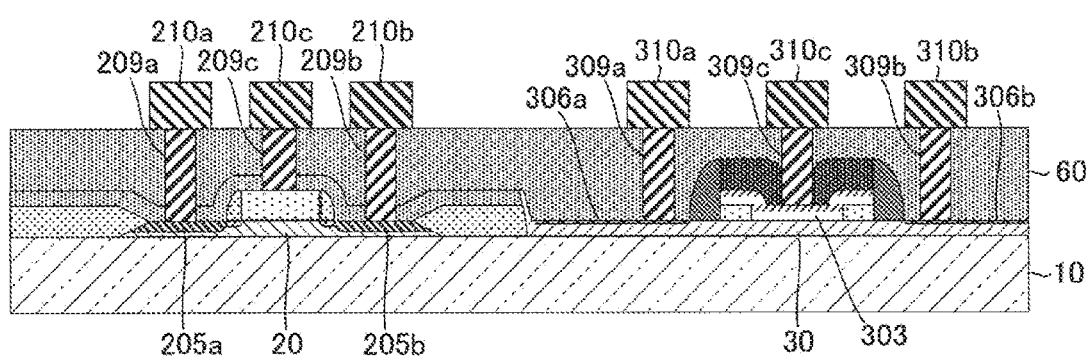

Next, a known CVD method is used to sequentially form a titanium (Ti) film having a thickness of approximately 50 nm, and a tungsten film (W) having a thickness of approximately 1 μm, so as to cover the entire surface of the second insulating film 60. Accordingly, each contact hole formed by the prior processes is buried by layered films formed from a titanium film and a tungsten film. Next, known etching technology or CMP technology is used to remove the titanium film and the tungsten film deposited on the second insulating film 60. Accordingly, vias 209a, 209b, and 209c that are respectively connected to the source 205a, the drain 205b, and the gate 203a of the MOSFET formed in the silicon layer 20 are formed, and vias 309a, 309b, and 309c that are respectively connected to the source 306a, the drain 306b, and the gate 303 of the MESFET formed in the oxide semiconductor layer 30 are also formed (FIG. 6R).

Next, a known sputtering method is used to form a conductive film having a thickness of approximately 1 μm configured by aluminum (Al) or an aluminum alloy so as to cover the entire surface of the second insulating film 60. Then, known photolithography technology and etching technology are used to pattern the conductive film. Accordingly, a source wiring line 210a, a drain wiring line 210b, and a gate wiring line 210c of the MOSFET formed to the silicon layer 20 are formed, and a source wiring line 310a, a drain wiring line 310b, and a gate wiring line 310c of the MESFET formed to the oxide semiconductor layer 30 are also formed (FIG. 6S). A silicon device formed to the silicon layer 20 may be electrically connected to an oxide semiconductor device formed to the oxide semiconductor layer 30 by these wiring lines.

An example of a case in which a MESFET is formed in the oxide semiconductor layer 30 has been described above. A case in which a MOSFET is formed in the oxide semiconductor layer 30 is described below. FIG. 7A to FIG. 7H are cross-sections illustrating examples of manufacturing methods in cases in which a MOSFET is formed to the oxide semiconductor layer 30. Note that in FIG. 7A to FIG. 7H, silicon devices that are formed to the silicon layer 20 are omitted from illustration.

Figure 7A:
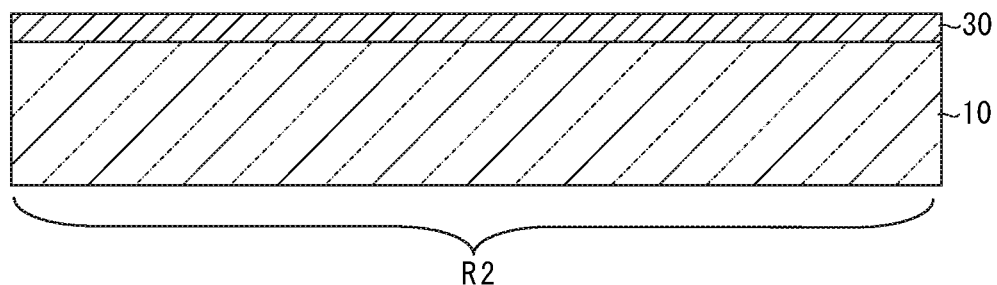
FIG. 7A to FIG. 7H are cross-sectional views illustrating a manufacturing method of a semiconductor device according to an exemplary embodiment of the present disclosure.

After forming silicon devices in the silicon layer 20 similarly to in cases in which a MESFET is formed, the surface of the sapphire substrate 10 is exposed at the second region R2 on the sapphire substrate 10, and a known mist CVD method is used to form the oxide semiconductor layer 30, which has a thickness of 150 nm or less and is configured by a single corundum type crystal of gallium oxide, at the exposed portion of the sapphire substrate 10 (FIG. 7A).

Figure 7B:
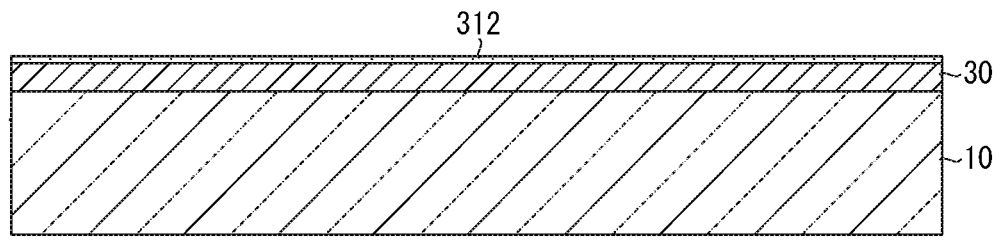

Continuing, a gate insulating film 312 configured by an insulator such as aluminum oxide (Al$_2$O$_3$) is formed on the surface of the oxide semiconductor layer 30 using a mist CVD method (FIG. 7B). Note that the gate insulating film 312 may be configured by silicon oxide (SiO$_2$) formed using a known CVD method. In such cases, from the viewpoint of suppressing characteristic fluctuations of silicon devices formed in the silicon layer 20, the film formation temperature of the silicon oxide (SiO$_2$) is preferably suppressed to 500° C. or lower.

Figure 7C:
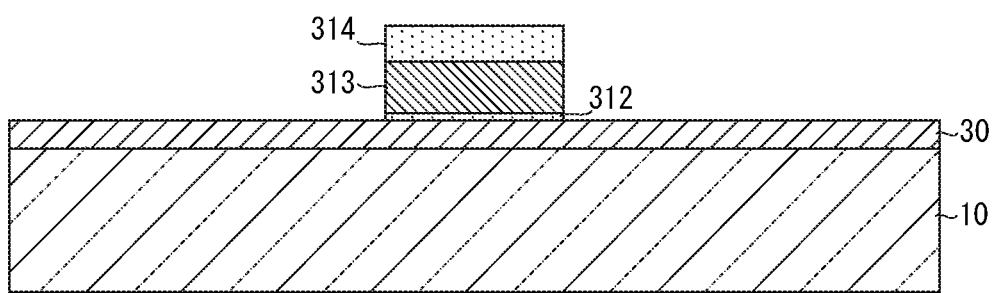

Next, known photolithography technology is used to form, on the gate insulating film 312, a resist mask including an opening portion in a region corresponding to the gate electrode. Then, a conductive film having a thickness of approximately 250 nm configured by a conductor such as gold (Au), which serves as the material of the gate 313, is formed on the resist mask and on the gate insulating film 312 by a known vapor deposition method. Then, the insulating film 314 having a thickness of approximately 150 nm configured by an insulator such as silicon oxide (SiO$_2$) is formed on the conductive film using a known low temperature CVD method. Next, a lift-off method is used to pattern the insulating film 314 and the conductive film and form a layered body formed from the gate insulating film 312, the gate 313, and the insulating film 314 on the oxide semiconductor layer 30 (FIG. 7C).

Figure 7D:
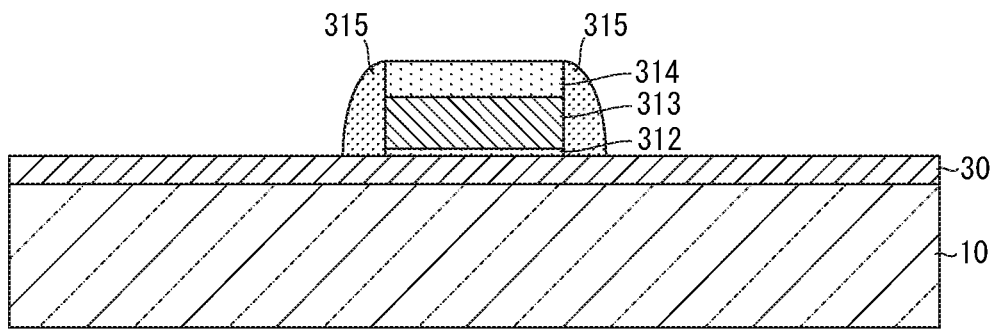

Next, a silicon nitride film having a thickness of approximately 150 nm is formed on the oxide semiconductor layer 30 so as to cover the layered body formed from the gate insulating film 312, the gate 313, and the insulating film 314. Then, the side walls 315 that cover the side faces of the layered body formed from the gate insulating film 312, the gate 313, and the insulating film 314 are formed by etching the silicon nitride film using known anisotropic etching technology (FIG. 7D).

Figure 7E:
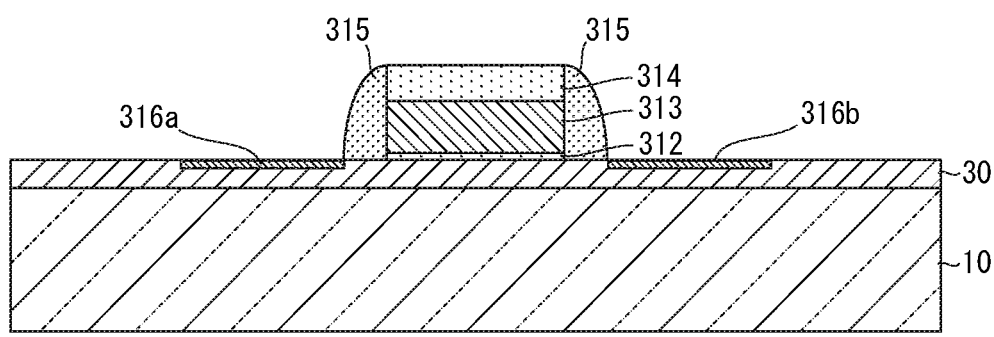

Next, a known sputtering method is used to deposit a metal such as titanium (Ti), which is capable of forming an ohmic contact with the oxide semiconductor layer 30, at positions that interpose the gate 313 of the surface of the oxide semiconductor layer 30, thereby forming the source 316a and the drain 316b (FIG. 7E).

Figure 7F:
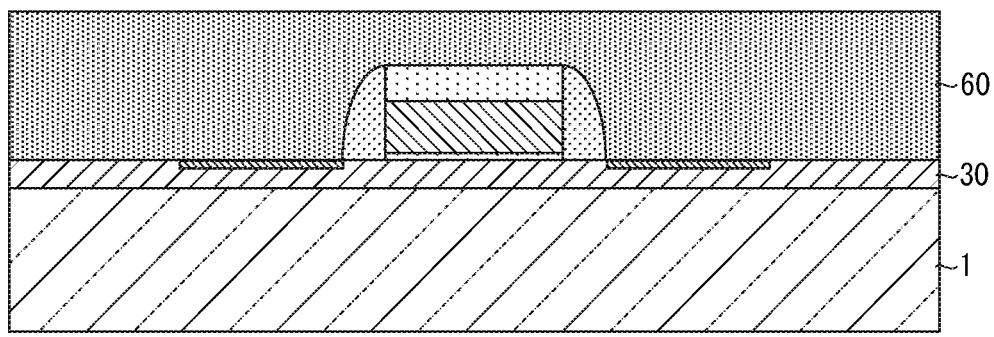

Next, a known CVD method is used to form the insulating film 60, which has a thickness of approximately 1200 nm and is configured by an insulator such as silicon oxide ($SiO_2$), on the entire surface of the sapphire substrate 10, including the formation region of the silicon layer 20 and the formation region of the oxide semiconductor layer 30. Then, known CMP technology is used to planarize the surface of the insulating film 60. The thickness of the insulating film 60 after planarization is, for example, approximately 800 nm (FIG. 7F).

Figure 7G:
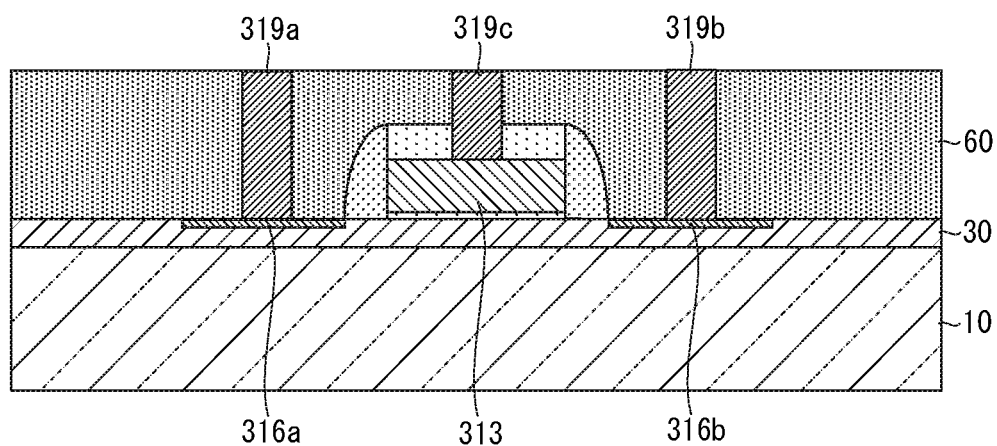

Next, known photolithography technology and etching technology are used to form contact holes that respectively reach to the source 316a, the drain 316b, and the gate 313 of the MOSFET. Next, a known CVD method is used to sequentially form a titanium (Ti) film having a thickness of approximately 50 nm and a tungsten (W) film having a thickness of approximately 1 µm so as to cover the entire surface of the insulating film 60. Accordingly, each of the contact holes formed by the prior processes are buried by a layered film formed from the titanium film and the tungsten film. Next, known etching technology or CMP technology is used to remove the titanium film and the tungsten film deposited on the insulating film 60. This forms the vias 319a, 319b, and 319c that are respectively connected to the source 316a, the drain 316b, and the gate 313 of the MOSFET formed on the oxide semiconductor layer 30 (FIG. 7G).

Figure 7H:
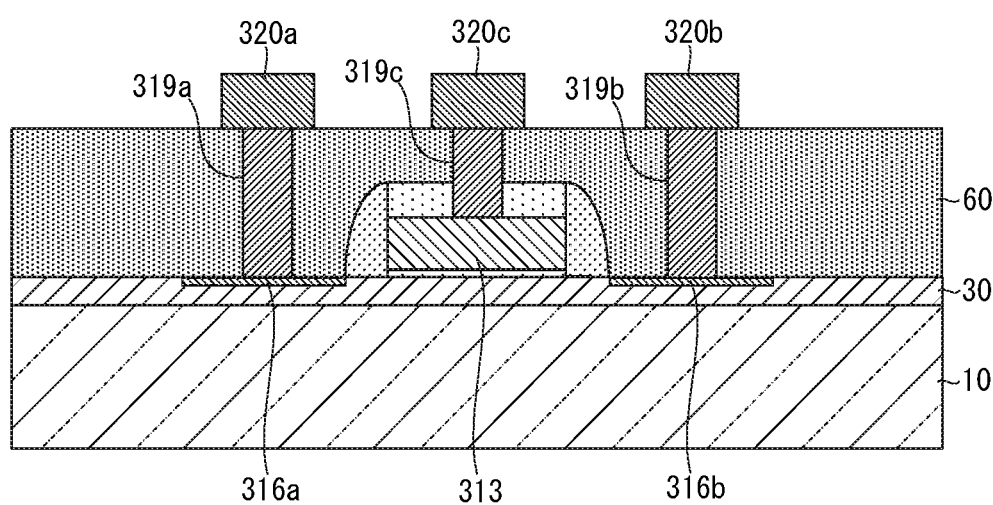

Next, a known sputtering method is used to form a conductive film having a thickness of approximately 1 µm configured by aluminum (Al) or an aluminum alloy so as to cover the entire surface of the insulating film 60. Then, known photolithography technology and etching technology are used to pattern the conductive film. This forms the source wiring line 320a, the drain wiring line 320b, and the gate wiring line 320c of the MOSFET formed on the oxide semiconductor layer 30 (FIG. 7H).

Figure 8A:
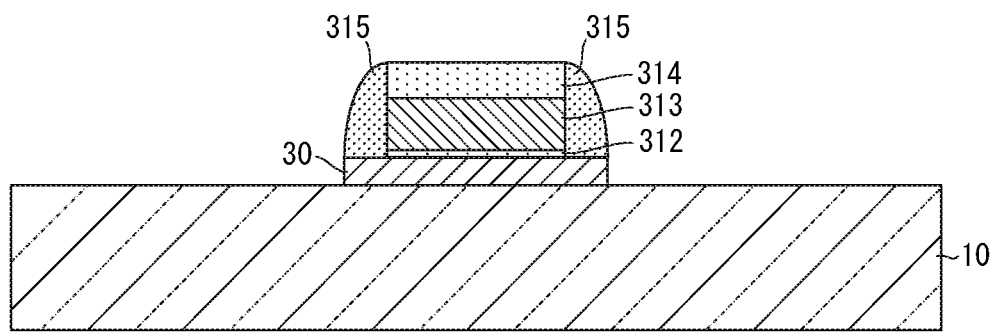
FIG. 8A to FIG. 8C are cross-sectional views illustrating a manufacturing method of a semiconductor device according to an exemplary embodiment of the present disclosure.
Figure 8B:
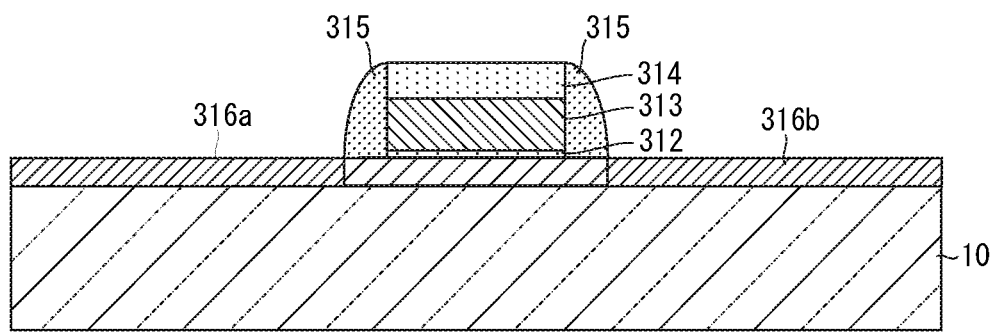
Figure 8C:
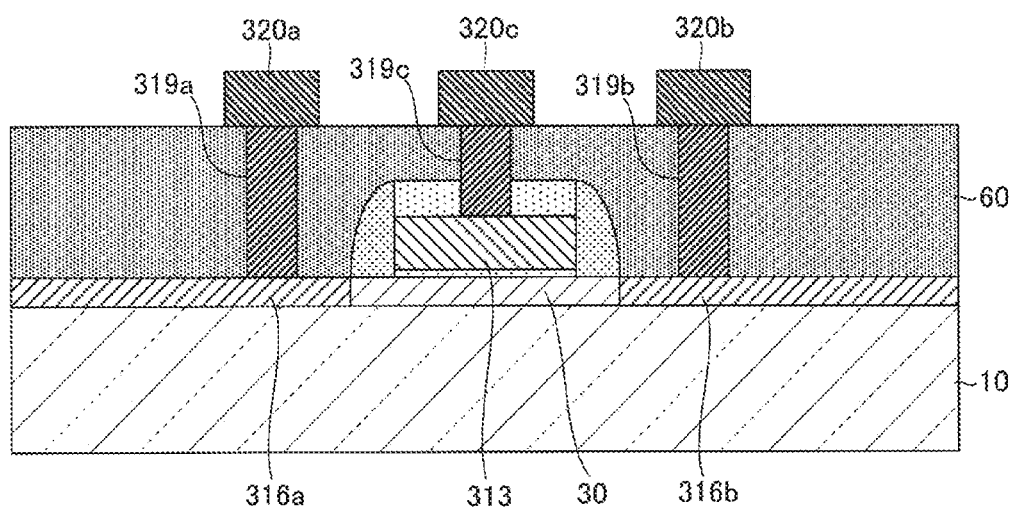

Note that, in the exemplary embodiment above, an example is given of a case in which the source and drain of the MOSFET are formed using a metal that forms an ohmic contact with the oxide semiconductor layer 30. However, the source and the drain of the MOSFET may be formed as follows. FIG. 8A to FIG. 8C are cross-sectional views illustrating examples of formation methods of the source and the drain of the MOSFET.

After the side walls 315 have been formed on the side faces of the layered body formed from the gate insulating film 312, the gate 313, and the insulating film 314, the oxide semiconductor layer 30 is removed by etching with the layered body and the side walls 315 serving as masks, thereby exposing the surface of the sapphire substrate 10. Note that regions other than the MOSFET are protected by a resist where necessary (FIG. 8A).

Next, the source 316a and the drain 316b, which are configured by single corundum type crystals of gallium oxide, are formed at the exposed portion of the sapphire substrate 10 using a known mist CVD method. The carrier densities of the source 316a and the drain 316b are set to $1 \times 10^{19}/cm^3$ or higher, which is sufficiently higher than the body portion directly below the gate 313, by adding Sn to the film-forming material as an impurity.

Subsequently, the insulating film 60, the vias 319a, 319b, and 319c, the source wiring line 320a, the drain wiring line 320b, and the gate wiring line 320c are formed using methods similar to those above.

Note that, a known ion implantation method may also be employed as alternative example of a formation method of the source and the drain of the MOSFET. Namely, after forming the side walls 315 at the side faces of the layered body formed from the gate insulating film 312, the gate 313, and the insulating film 314, the source and the drain of the MOSFET may be formed by injecting impurity ions into the surface layer portion of the oxide semiconductor layer 30 with the layered body and the side walls 315 serving as a mask. In such cases, a small amount of Al may be added during the growth of the oxide film semiconductor $Ga_2O_3$. Accordingly, even at 600° C. or higher, the a form of the $Ga_2O_3$ can be suppressed from undergoing phase transition to the most stable 13 form. This enables ion-injected Sn to be better activated.

As made clear by the above description, the semiconductor device 1 according to the present exemplary embodiment of the present disclosure includes the silicon layer 20 provided in the first region R1 of the surface of the sapphire substrate 10, and the oxide semiconductor layer 30 provided in the second region R2 of the surface of the sapphire substrate 10 adjacent to the first region R1. Active elements such as a MOSFET and a bipolar transistor and passive elements such as a resistor element and a capacitor can be formed in the silicon layer 20 as silicon devices, and, for example, an integrated circuit that includes a CMOS circuit or an analog circuit may be configured in combination with the silicon devices. On the other hand, a MESFET, a MOSFET, an SBD, or the like, for example, may be formed as an oxide semiconductor device formed from gallium oxide ($Ga_2O_3$) in the oxide semiconductor layer 30, and these elements may be configured as, for example, a power device having a high breakdown voltage and a high current capacity.

Oxide semiconductors such as $Ga_2O_3$ enable the ON resistance per unit of area to be $1/1000$ that of a silicon device or less. In the semiconductor device 1 according to the present exemplary embodiment, an oxide semiconductor device having different properties from a silicon device is provided together with a silicon device on the same sapphire substrate.

The semiconductor device 1 according to the present exemplary embodiment of the present disclosure enables a power device formed in the oxide semiconductor layer 30 and a power module that includes a control circuit formed in the silicon layer 20 to be housed on a single chip, and, for example, enables a power module that employs a DC-DC converter 400, like that illustrated in FIG. 4, to be configured.

The power module configured by the semiconductor device 1 according to the present exemplary embodiment of the present disclosure may reduce the surface area of the power device region to only a few tenths of the size, or to less than a few tenths of the size, of a conventional power module in which the power device and the control circuit are both formed in the silicon layer, while maintaining equivalent or better performance. In a conventional power module in which both a power device and a control circuit are both formed in a silicon layer, the ratio of occupied surface area of the power device in the chip is high, at from 60% to 90%. Accordingly, by configuring the power device using an oxide semiconductor, the chip size can be reduced to a fraction of the size compared to a conventional power module configured by a silicon device alone, while maintaining equivalent performance or better. Further, making the surface area of the power device region significantly smaller may enable various parasitic capacitance components to be greatly diminished, and enables the total energy loss to be significantly improved.

In terms of cost, sapphire substrates are becoming increasingly inexpensive, and are lower in cost than SOI substrates in a case in which the sapphire substrate is 6 inches. Further, the price of SOS substrates that compete with sapphire substrates and silicon substrates are also expected to decrease from now onward. Accordingly, the semiconductor device 1 according to the present exemplary embodiment of the present disclosure may achieve a reduction in the cost of a power module by greatly reducing the chip size.

Further, in the semiconductor device 1 according to the present exemplary embodiment of the present disclosure, the silicon device formed in the silicon layer 20 and the oxide semiconductor device formed in the oxide semiconductor layer 30 are formed on the sapphire substrate 10, which is an insulator. This configuration may reduce the parasitic capacitance between the wiring lines provided in the wiring line layer 50 and the sapphire substrate 10, and may significantly suppress the energy loss and signal delay caused by such parasitic capacitance. Further, reducing parasitic capacitance between the wiring lines and the sapphire substrate 10 may significantly reduce the noise entering the wiring lines and noise coming around from the substrate, and may simplify the circuit design.

Second Exemplary Embodiment

A manufacturing method of the semiconductor device according to the first exemplary embodiment above includes using a lift-off method, which employs the stopper film 501 and the sacrificial film 502, to remove an oxide semiconductor X deposited on the first insulating film 208, which covers the silicon layer 20. In contrast thereto, a manufacturing method according to a second exemplary embodiment of the present disclosure includes a process for suppressing deposition of the oxide semiconductor X on the first insulating film 208 that covers the silicon layer 20.

FIG. 9A to FIG. 9D are diagrams illustrating a manufacturing method of a semiconductor device according to the second exemplary embodiment of the present disclosure, and are cross-sectional views illustrating the first region R1 where the silicon layer (silicon devices) is formed. In FIG. 9A to FIG. 9D, the second region R2 where the oxide semiconductor layer (the oxide semiconductor devices) will be formed is omitted from illustration (see FIG. 1).

Figure 9A:
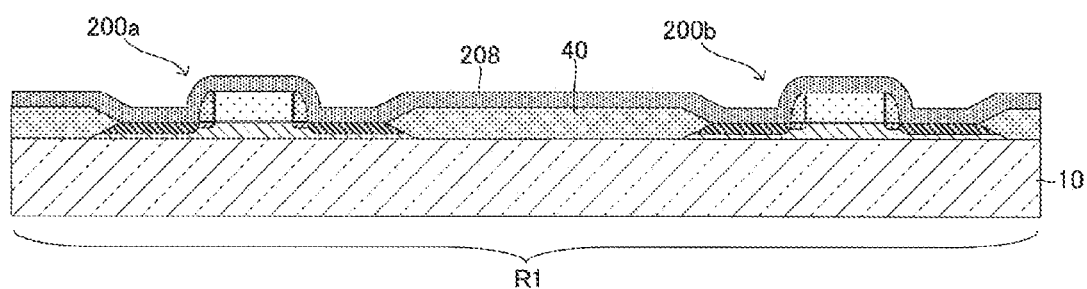
FIG. 9A to FIG. 9D are cross-sectional views illustrating a manufacturing method of a semiconductor device according to an exemplary embodiment of the present disclosure.

As illustrated in FIG. 9A, in the first region R1 on the sapphire substrate 10, silicon devices 200a and 200b are formed, and then the first insulating film 208, which covers the silicon devices 200a and 200b, is formed. The insulating-separating film 40 is provided between the silicon device 200a and the silicon device 200b.

Figure 9B:
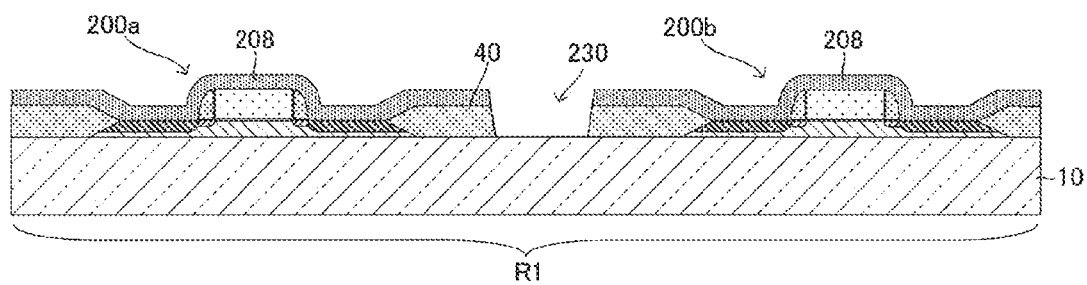

Next, the first insulating film 208 and the insulating-separating film 40 extending between the silicon device 200a and the silicon device 200b are removed by etching. This forms an exposed portion 230 in which the surface of the sapphire substrate 10 is exposed in a region between the silicon device 200a and the silicon device 200b (FIG. 9B). Note that the etching process is implemented by an etching process for exposing the surface of the sapphire substrate 10 in the second region R2 (see FIG. 1) where the oxide semiconductor layer (oxide semiconductor devices) will be formed (see FIG. 6H).

Figure 9C:
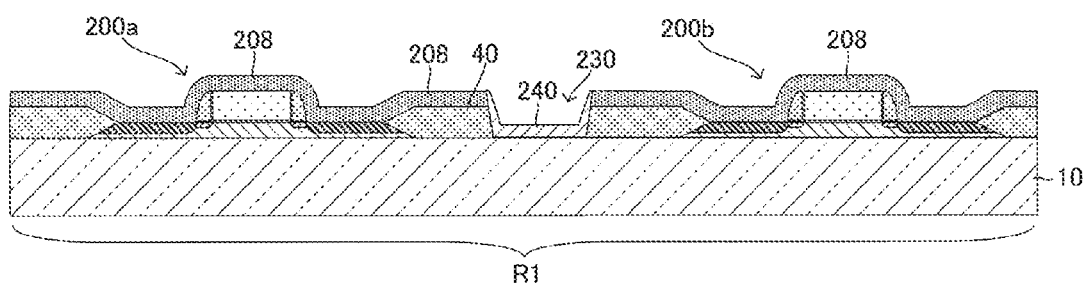

Next, a known mist CVD method is used to form an oxide semiconductor layer in the second region R2 of the sapphire substrate 10 (see FIG. 1). When doing so, an oxide semiconductor 240 is also deposited in the exposed portion 230 formed in the first region R1 of the sapphire substrate 10 (FIG. 9C). Namely, a product generated by the film-forming material of the oxide semiconductor introduced into a reaction oven of a mist CVD device is selectively deposited, in the first region R1 where the silicon layer (silicon devices) is formed, on the exposed portion 230 where the sapphire substrate 10 is exposed. Accordingly, deposition of oxide semiconductor on the first insulating film 208 that covers the silicon devices 200a and 200b can be suppressed.

Figure 9D:
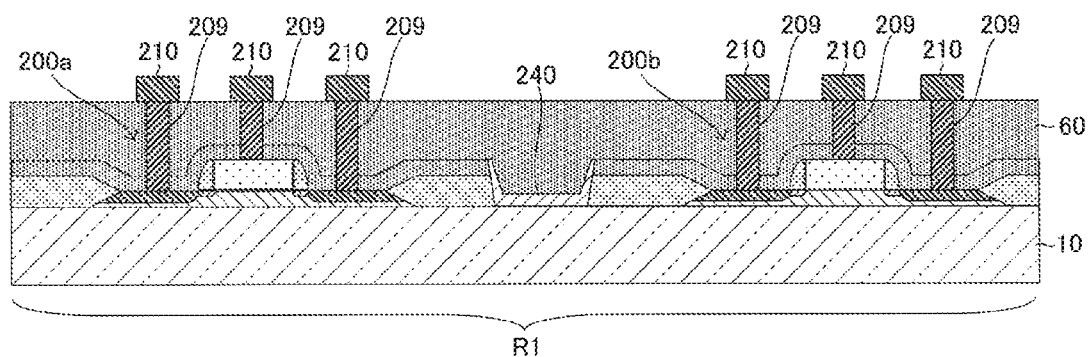

After forming an oxide semiconductor device in the second region R2, the insulating film 60 is formed covering the silicon devices 200a and 200b and the oxide semiconductor device. Next, vias 209 and wiring lines 210 that connect to the silicon devices 200a and 200b are formed, and vias and wiring lines that connect to the oxide semiconductor devices are also formed (FIG. 9D). The oxide semiconductor 240 deposited on the exposed portion 230 remains within the first region R1 as what is known as a dummy portion, where circuits such as transistors are not formed. Namely, the entire surface of the oxide semiconductor 240 is covered by the insulating film 60, without electrodes connecting to the oxide semiconductor 240.

Figure 10:
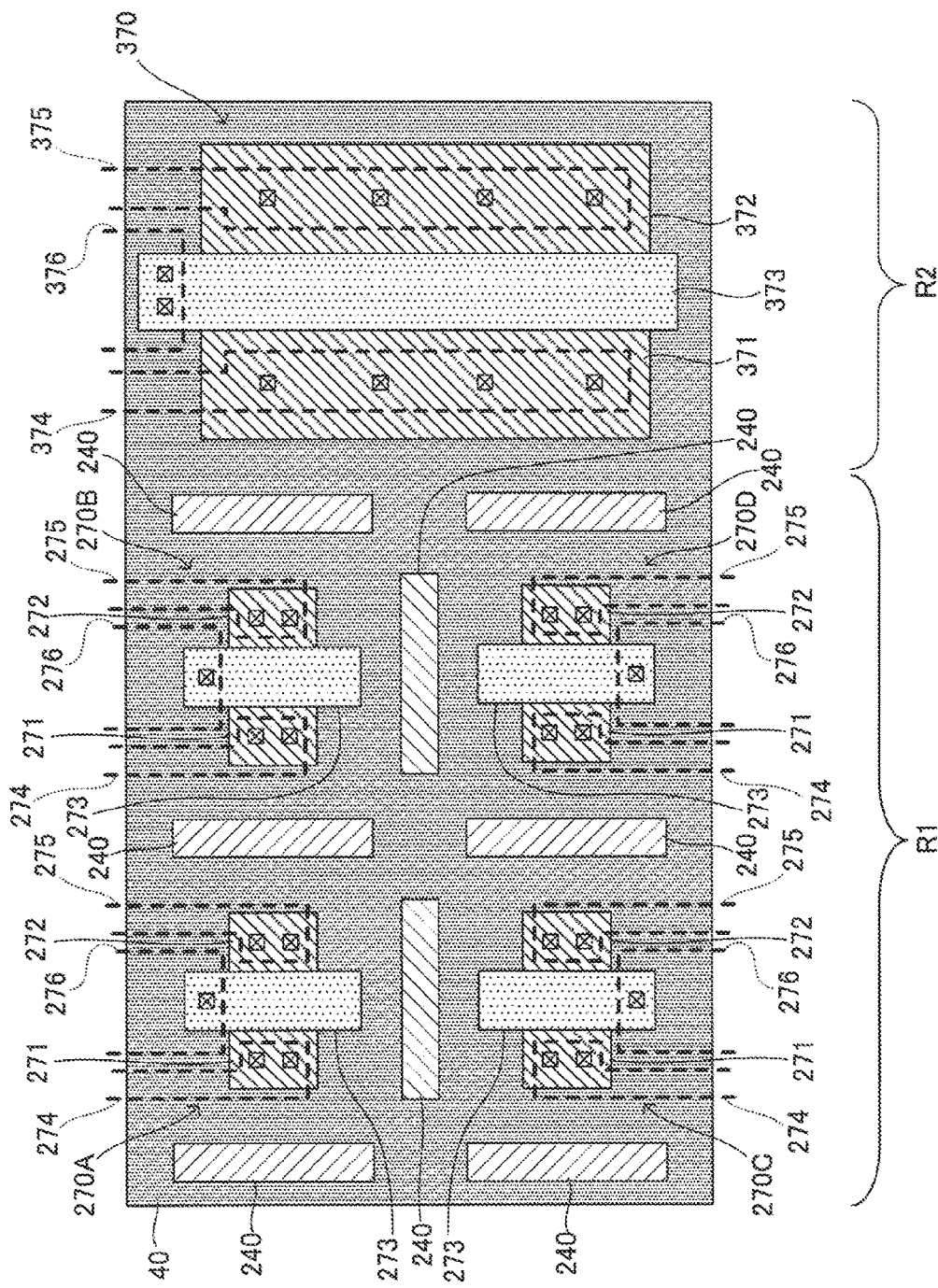
FIG. 10 is a plan view illustrating an example of placement of an exposed portion according to an exemplary embodiment of the present disclosure.

FIG. 10 is a plan view illustrating an example of placement of the oxide semiconductor 240 deposited on the surface of the exposed portions 230, which are formed in the first region R1 (see FIG. 9B). Note that FIG. 10 illustrates an example of a case in which MOSFETs 270A, 270B, 270C, and 270D are formed as the silicon devices in the first region R1 on the sapphire substrate, and a MOSFET 370 is formed as the oxide semiconductor device in the second region R2 on the sapphire substrate. The MOSFETs 270A to 270D serving as the silicon devices each include a source 271, a drain 272, and a gate 273. A source wiring line 274 is connected to each source 271, a drain wiring line 275 is connected to each drain 272, and a gate wiring line 276 is connected to each gate 273. The MOSFET 370 serving as the oxide semiconductor device includes a source 371, a drain 372, and a gate 373. A source wiring line 374 is connected to the source 371, a drain wiring line 375 is connected to the drain 372, and a gate wiring line 376 is connected to the gate 373. FIG. 10 illustrates an example of a case in which the oxide semiconductor 240 is deposited on the surface of each of the exposed portions 230, which are provided in regions between adjacent silicon devices. Namely, the oxide semiconductor 240 deposited on the surface of each exposed portion 230 is respectively provided in a region between the MOSFET 270A and the MOSFET 270B, a region between the MOSFET 270A and the MOSFET 270C, a region between the MOSFET 270B and the MOSFET 270D, and a region between the MOSFET 270C and the MOSFET 270D. Note that in FIG. 10, the insulating film covering the MOSFETs 270A to 270D and the MOSFET 370 is not illustrated, and the source wiring lines 274 and 374, the drain wiring lines 275 and 375, and the gate wiring lines 276 and 376 are drawn in perspective view.

When forming the oxide semiconductor layer 30 as a film in the second region R2, oxide semiconductor is selectively deposited in the exposed portions 230 provided in regions between adjacent silicon devices in the first region R1, and deposition of oxide semiconductor on the insulating film covering the MOSFETs 270A to 270D (not illustrated in FIG. 10) is suppressed.

Note that the placement, size, shape, and formation range of the exposed portions 230 can be modified as appropriate. Further, the manufacturing method according to the present exemplary embodiment may instead include a lift-off method that employs the stopper film 501 and the sacrificial film 502 that were applied in the manufacturing method according to the first exemplary embodiment above, or may employ the lift-off method in a combination.

Third Exemplary Embodiment

Figure 11A:
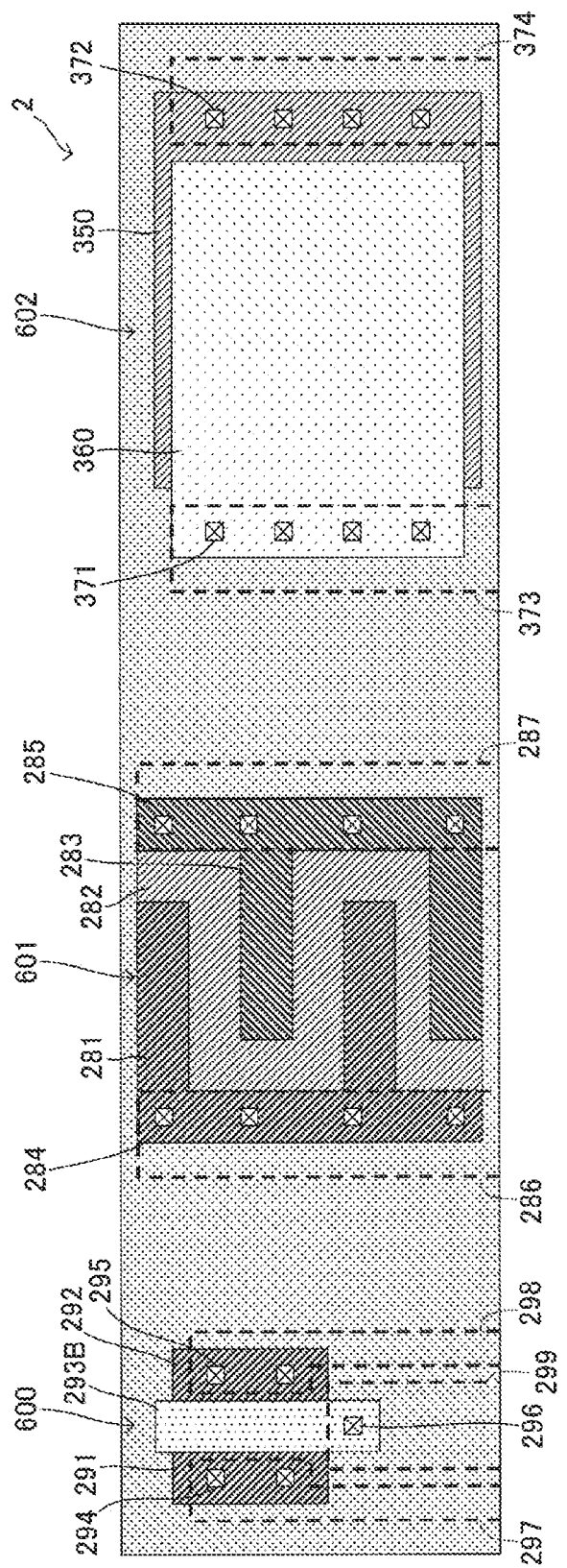
FIG. 11A and FIG. 11B are plan views illustrating a configuration of a semiconductor device according to alternative exemplary embodiment of the present disclosure.
Figure 11B:
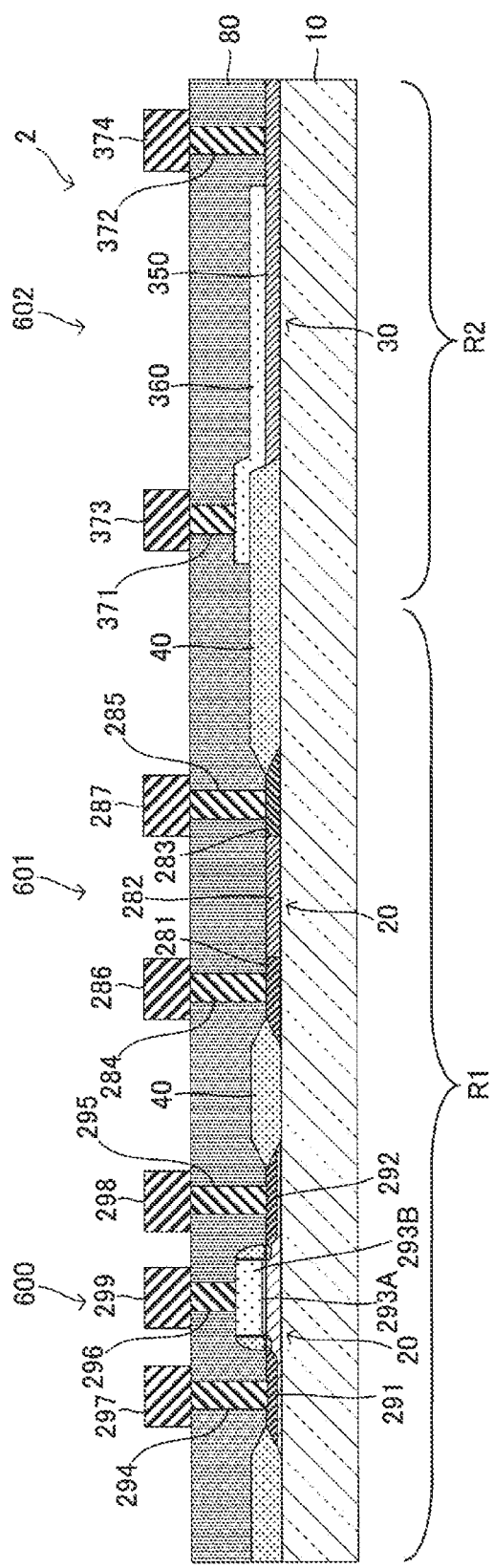

FIG. 11A and FIG. 11B are, respectively, a plan view and a cross-sectional view illustrating a configuration of a semiconductor device 2 according to a third exemplary embodiment of the present disclosure. The semiconductor device 2 includes an integrated circuit 600 and a first light receiving element 601 as silicon devices formed in the silicon layer 20 in the first region R1 on the sapphire substrate 10. Further, the semiconductor device 2 includes a second light receiving element 602 serving as an oxide semiconductor device formed in the oxide semiconductor layer 30 in the second region R2 on the sapphire substrate 10.

The first light receiving element 601 includes a high-concentration p region 281, a low-concentration p region 282, and a high-concentration n region 283 configured by monocrystalline silicon. The first light receiving element 601 is a photodiode that generates photocurrent in accordance with an amount of light illuminated thereon. As illustrated in FIG. 11A, the plan view shapes of the high-concentration p region 281 and the high-concentration n region 283 are toothed-comb shaped and are in a pattern in which teeth of one comb jut out into regions between the teeth of the other comb. Such a pattern enables a pn junction surface area to be increased. The low-concentration p region 282 is provided between the high-concentration p region 281 and the high-concentration n region 283. An anode wiring line 286 is connected to the high-concentration p region 281 through a via 284, and a cathode wiring line 287 is connected to the high-concentration n region 283 through a via 285. The first light receiving element 601, which is configured by monocrystalline silicon, is mostly sensitive toward the visible region of light.

The second light receiving element 602 includes an n-type oxide semiconductor region 350 that is configured by a corundum type gallium oxide ($Ga_2O_3$) semiconductor, and a transparent electrode 360 that partially covers the surface of the oxide semiconductor region 350. In the second light receiving element 602, a Schottky barrier is formed between the oxide semiconductor region 350 and the transparent electrode 360, and the second light receiving element 602 is a photodiode that generates a photocurrent in accordance with an amount of light illuminated thereon. The transparent electrode 360 may, for example, be configured by a conductive organic film having optical transmissivity such as PEDOT-PSS: poly(3,4-ethylene-dioxythiophene) polystyrene sulfonate. An anode wiring line 373 is connected to the transparent electrode 360 through vias 371, and a cathode wiring line 374 is connected to the oxide semiconductor region 350 through vias 372. The second light receiving element 602 configured by a gallium oxide ($Ga_2O_3$) semiconductor, which has a band gap of approximately 5 eV, is primarily sensitive to ultraviolet rays and deep ultraviolet rays.

The integrated circuit 600 is configured including a detection circuit that detects the magnitude of the photocurrent generated by the first light receiving element 601 and the magnitude of the photocurrent generated by the second light receiving element 602, and a storage circuit or the like that stores the detected value of the photocurrent. FIG. 11A and FIG. 11B illustrate an example in which a MOSFET serves as a circuit element configured by the integrated circuit 600. The MOSFET includes a source 291 and a drain 292 provided to the silicon layer 20, and a gate 293B provided to the surface of the silicon layer 20 with a gate insulating film 293A interposed between the gate 293B and the surface of the silicon layer 20. A source wiring line 297 is connected to the source 291 through a via 294, a drain wiring line 298 is connected to the drain 292 through a via 295, and a gate wiring line 299 is connected to the gate 293B through a via 296.

The first light receiving element 601 and the second light receiving element 602 are insulated and separated from each other by the insulating-separating film 40, which is provided between the first light receiving element 601 and the second light receiving element 602. Further, the first light receiving element 601 and the integrated circuit 600 are insulated and separated from each other by the insulating-separating film 40, which is provided between the first light receiving element 601 and the integrated circuit 600. An insulating film 80 covers the silicon layer 20 and the oxide semiconductor layer 30. Note that the insulating film 80 is not illustrated in FIG. 11A, and the anode wiring lines 286 and 373, the cathode wiring lines 287 and 374, the source wiring line 297, the drain wiring line 298, and the gate wiring line 299 are drawn as if they were see-through.

In the semiconductor device 2 according to the present exemplary embodiment, the first light receiving element 601 and the second light receiving element 602 are configured by semiconductor materials having different properties, and have sensitivity to different wavelength regions. Accordingly, the semiconductor device 2 according to the present exemplary embodiment enables wideband light to be detected by these two light receiving elements. In particular, since the second light receiving element 602 configured by a gallium oxide ($Ga_2O_3$) semiconductor is sensitive toward ultraviolet rays and deep ultraviolet rays, the semiconductor device 2 according to the present exemplary embodiment is well-suited to applications such as fire detectors and fire alarms.

What is claimed is:

1. A semiconductor device comprising:
   a substrate including a first region and a second region at a surface of the substrate, the first region adjacent to the second region;
   a silicon layer provided at the first region; and
   an oxide semiconductor layer having a crystal structure provided at the second region,
   wherein the substrate and the oxide semiconductor layer have a corundum type crystal structure.

2. The semiconductor device of claim 1, wherein the substrate is a sapphire substrate, and the oxide semiconductor layer includes gallium oxide.

3. The semiconductor device of claim 1, further comprising an insulator at an interface between the silicon layer and the oxide semiconductor layer.

4. The semiconductor device of claim 1, further comprising:
   a silicon device formed at the silicon layer;
   an oxide semiconductor device formed at the oxide semiconductor layer; and a wiring line connecting the silicon device to the oxide semiconductor device.

5. The semiconductor device of claim 4, wherein the silicon device configures a control circuit that controls the oxide semiconductor device.

6. The semiconductor device of claim 4, wherein the oxide semiconductor device is a field effect transistor including a gate forming a Schottky barrier with the oxide semiconductor layer.

7. The semiconductor device of claim 4, wherein the oxide semiconductor device is a field effect transistor including a gate provided at a surface of the oxide semiconductor layer, and an insulating film interposed between the gate and the surface of the oxide semiconductor layer.

8. The semiconductor device of claim 1, further comprising a dummy portion having an oxide semiconductor deposited on the substrate in the first region, the oxide semiconductor of the dummy portion is the same as an oxide semiconductor configuring the oxide semiconductor layer.

9. The semiconductor device of claim 8, wherein a plurality of silicon devices are provided on the silicon layer, and the dummy portion is provided at a region between the silicon devices.

10. The semiconductor device of claim 1, further comprising:
   a first light receiving element formed in the silicon layer; and
   a second light receiving element formed in the oxide semiconductor layer.

11. The semiconductor device of claim 10, further comprising a detection circuit formed in the silicon layer, the detection circuit detecting photocurrent generated by the first light receiving element and photocurrent generated by the second light receiving element.

12. A manufacturing method of a semiconductor device, comprising:
   forming a silicon device in a first region of a silicon layer provided on a surface of a substrate;
   partially exposing the surface of the substrate by removing a second region of the silicon layer, the second region being adjacent to the first region;
   forming an oxide semiconductor layer on the exposed portion of the substrate; and
   forming an oxide semiconductor device on the oxide semiconductor layer.

13. The manufacturing method of a semiconductor device of claim 12, further comprising connecting the silicon device to the oxide semiconductor device by a wiring line.

14. The manufacturing method of claim 12, further comprising, prior to said forming the oxide semiconductor layer, forming another exposed portion that partially exposes the surface of the substrate inside the first region of the silicon layer.

15. The manufacturing method of claim 12, further comprising:
   prior to said forming the oxide semiconductor layer, forming a film of at least one layer that covers the silicon layer; and
   after said forming the oxide semiconductor layer, removing the film.

16. The manufacturing method of claim 15, wherein
   the film is configured including a stopper film and a sacrificial film,
   said removing the film includes a first etching process of etching the sacrificial film and a second process of etching the stopper film, and
   the stopper film has an etching rate lower than an etching rate of the sacrificial film with respect to an etchant employed to etch the sacrificial film.

* * * * *